(12) United States Patent
Ito

(10) Patent No.: US 7,838,962 B2
(45) Date of Patent: Nov. 23, 2010

(54) SEMICONDUCTOR DEVICE HAVING CAPACITOR, TRANSISTOR AND DIFFUSION RESISTOR AND MANUFACTURING METHOD THEREOF

(75) Inventor: Hiroyasu Ito, Nagoya (JP)

(73) Assignee: Denso Corporation, Kariya (JP)

( * ) Notice: Subject to any disclaimer, the term of this patent is extended or adjusted under 35 U.S.C. 154(b) by 141 days.

(21) Appl. No.: 12/285,577

(22) Filed: Oct. 9, 2008

(65) Prior Publication Data
US 2009/0160017 A1    Jun. 25, 2009

(30) Foreign Application Priority Data
Dec. 21, 2007    (JP) .............................. 2007-330124

(51) Int. Cl.
H01L 29/70    (2006.01)
H01L 21/70    (2006.01)
H01L 21/77    (2006.01)
(52) U.S. Cl. ........................ 257/528; 257/532; 257/536; 257/E21.538; 257/E21.577; 257/E21.578; 257/E29.025; 438/324; 438/639; 438/238
(58) Field of Classification Search .................. 257/528, 257/532, 536, 539, E29.025, E21.598, E21.538, 257/E21.577, E21.578; 438/637, 639, 238, 438/239, 294, 624, 324, 329, 330
See application file for complete search history.

(56) References Cited

U.S. PATENT DOCUMENTS

| | | | |
|---|---|---|---|
| 5,284,794 A * | 2/1994 | Isobe et al. | ................... 438/385 |
| 5,327,224 A | 7/1994 | Ikegami et al. | |
| 5,420,053 A | 5/1995 | Miyazaki | |
| 5,470,764 A | 11/1995 | Ikegami et al. | |
| 5,591,656 A * | 1/1997 | Sawada | ....................... 438/324 |
| 5,915,186 A * | 6/1999 | Gomi | ......................... 438/313 |
| 6,791,156 B2 | 9/2004 | Itou | |
| 6,806,192 B2 * | 10/2004 | Lin et al. | .................... 438/687 |
| 2004/0142534 A1 * | 7/2004 | Yoo et al. | ................... 438/311 |
| 2009/0160017 A1 * | 6/2009 | Ito | .............................. 257/528 |

FOREIGN PATENT DOCUMENTS

| | | |
|---|---|---|
| JP | A-63-248157 | 10/1988 |
| JP | A-2-100339 | 4/1990 |
| JP | A-11-274410 | 10/1999 |

OTHER PUBLICATIONS

"Reliability Technology of Semiconductor Device," JUSE Press, Ltd; First Edition, Jul. 1988 (Partial translation).
"Influence of Hydrogen on Electrical Characteristics of Poly-Si Resistor", Jpn. J. Appl. Phys. vol. 32 (1993), pp. 3732-3788 Part 1, No. 9A, Sep. 1993.

* cited by examiner

*Primary Examiner*—Mary Wilczewski
(74) *Attorney, Agent, or Firm*—Posz Law Group, PLC

(57) ABSTRACT

In manufacturing a semiconductor device including a substrate having a (111)-plane orientation and an off-set angle in a range between 3 degrees and 4 degrees, a capacitor, a transistor and a diffusion resistor are formed in the substrate, each of which are separated by a junction separation layer. A first silicon nitride film is formed by low pressure CVD over a surface of the substrate except a bottom portion of a contact hole and a portion over the junction separation layer, and a silicon oxide film is formed by low pressure CVD over the first silicon nitride film. A second silicon nitride film as a protecting film is formed by plasma CVD so as to cover the semiconductor device finally. Therefore, the semiconductor device having high reliability can be obtained.

48 Claims, 12 Drawing Sheets

SEMICONDUCTOR DEVICE HAVING CAPACITOR, TRANSISTOR AND DIFFUSION RESISTOR AND MANUFACTURING METHOD THEREOF

CROSS REFERENCE TO RELATED APPLICATION

This application is based on Japanese Patent Application No. 2007-330124 filed on Dec. 21, 2007, the disclosure of which is incorporated herein by reference.

FIELD OF THE INVENTION

The present invention relates to a semiconductor device having a capacitor, a transistor and a diffusion resistor and a manufacturing method thereof.

BACKGROUND OF THE INVENTION

In a bipolar semiconductor device, as shown in FIG. 14, using a silicon nitride film formed by plasma CVD (hereinafter referred to as "a plasma nitride film") as a final passivation film in order to suppress a deterioration of $h_{FE}$ of a transistor due to an external environment such as moisture and to obtain reliability is well-known, which is shown in "Reliability Technology of Semiconductor Device" published by JUSE Press, Ltd.

However, since a film stress of the plasma nitride film is high, a lifetime of wirings may be lowered. In addition, property variation of resistance of polysilicon due to residual hydrogen in the plasma nitride film while forming the film is reported recently in Jpn. J. Appl. Phys. Vol. 32 (1993) pp. 3734-3788 Part 1, No. 9A, September 1993.

As the conventional art to improve the property variation of resistance of polysilicon due to the residual hydrogen in the plasma nitride film, a prior art 1 shown in FIG. 15 is proposed, which is disclosed in Japanese Patent No. 2748070 corresponding to U.S. Pat. No. 5,470,764. Amount of hydrogen diffused into polysilicon resistor films 108a and 108b through oxide films 104 and 105, which are arranged under each of the films 108a and 108b, depends on thicknesses of the oxide films 104 and 105. Therefore, silicon nitride films 121, which are formed by low pressure CVD, are arranged as hydrogen ion shielding films under each of the polysilicon resistor films 108a and 108b. Thereby, diffusing of hydrogen from the base oxide film is suppressed and variation of resistance of the polysilicon resistor films is decreased.

Moreover, a prior art 2 shown in FIGS. 16A to 16C is proposed in Japanese Patent No. 2748070 as another art. According to the art, unlike the prior art 1, a polysilicon resistor element 207 formed over a semiconductor substrate, in which a bipolar device is formed, through a lower silicon nitride film 216, is covered by a covering oxide film 208. After that, a silicon nitride film 210 formed by low pressure CVD is formed to cover a surface of the semiconductor substrate including a junction separation layer. Thereby, diffusing of hydrogen into the polysilicon resistor element is suppressed and the variation of resistance of the polysilicon resistor element is decreased.

On the other hand, as an effect of the plasma nitride film with respect to $h_{FE}$ of a general bipolar transistor shown in FIG. 17, $h_{FE}$ of the bipolar transistor increases by the residual hydrogen in the plasma nitride film as shown in FIG. 18. In FIG. 18, XVIIIA represents $h_{FE}$ of the NPN transistor after forming the plasma nitride film, XVIIIB represents $h_{FE}$ of the NPN transistor after forming the aluminum wiring, XVIIIC represents $h_{FE}$ of the PNP transistor after forming the plasma nitride film, and XVIIID represents $h_{FE}$ of the PNP transistor after forming the aluminum wiring. In other words, increasing of $h_{FE}$ represents increasing of a gain of the bipolar transistor, and thereby, it is an advantage in terms of the transistor property.

However, a threshold value of a parasitic MOS type element (hereinafter referred to as "a field threshold voltage Vt", which is shown in a3 of FIG. 17, including a p-type diffusion layer 6 as a collector of a PNP transistor, a p-type diffusion resistor layer 7, a laminated portion including a thick thermal oxide film 9 and a thick CVD oxide film 10 (hereinafter referred to as "a field portion") and an aluminum wiring arranged over the laminated portion, decreases due to the residual hydrogen in the plasma nitride film, as shown in FIG. 19. The amount of decrease of the field threshold voltage Vt due to the residual hydrogen in the plasma nitride film depends on plane orientation of a substrate. In case that total film thickness of the oxide films in the field portion is 1.5 μm, when a silicon substrate having a (111)-plane orientation and an off-set angle in a range between 3 degrees and 4 degrees, which is used generally for a bipolar integrated semiconductor element, the field threshold voltage Vt decreases about 10V because of the residual hydrogen in the plasma nitride film.

In addition, in a capacitor in which an n-type diffusion layer 8 arranged in an n-type epitaxial layer 4 having a (111)-plane orientation and an off-set angle in a range between 3 degrees and 4 degrees is used as one electrode, as shown in FIG. 17, because of plane orientation and formation of an capacitor oxide film 11 on the n-type diffusion layer 8 having high impurity by thermal oxidation, it is difficult to obtain a reliable capacitor.

When the field threshold voltage Vt is low, it becomes easy for the parasitic element to operate. In other words, it means that malfunction of the semiconductor device becomes easy to occur. The substantial decreasing of the field threshold voltage Vt due to the residual hydrogen in the plasma nitride film causes serious reliability degradation for an in-vehicle high breakdown voltage bipolar semiconductor device having a withstand voltage of greater than or equal to 24 volts.

In order to increase the field threshold voltage Vt without decreasing the withstand voltage of the junction layer, making thicker a total thickness of the oxide films in the field portion is known generally. In case that the thickness of the oxide films in the field portion is further increased, wiring disconnection may be caused. In particular, in case that the thickness of the thick CVD oxide film 10 is further increased, cracks may generate in the CVD oxide film 10 and reliability degradation of the semiconductor device due to the cracks may occur.

On the other hand, with respect to suppressing the influence of the residual hydrogen in the plasma nitride film to elements of the bipolar transistor or the like, the prior art 2, which discloses that the surface of the semiconductor substrate is covered by the silicon nitride film formed by low pressure CVD, may be excellent. However, according to the prior art 2, the aluminum wiring is covered by the silicon nitride film formed by low pressure CVD, which has a large film stress, and the plasma nitride film, which is formed for protecting the elements. Therefore, a stress migration may generate and the lifetime of the wiring may be lowered significantly. In addition, in case that a thin film resistor such as metal and metal silicide is formed over the semiconductor substrate, a property of the thin film resistor may be changed because of the film stress of the silicon nitride film.

Moreover, in the bipolar semiconductor device, as an art to reduce the total film thickness of the field portion and improve a defect of the field portion due to gamma-rays, the prior art 3 shown in FIG. 20 is proposed, which is disclosed in Japanese Patent No. 2545953. In this art, a silicon nitride film 306 is formed between a thermal oxide film 305 and a CVD oxide film 307, and a p+ region layer 304 is formed in a base region of an NPN transistor. Thereby, an inversion at a surface of the p-type region due to gamma-rays is suppressed. According to the structure of the prior art 3, the total film thickness of the field portion can be decreased, and an aluminum wiring over the silicon nitride film 306 is formed with the CVD oxide film 307 interposed therebetween. Therefore, reliability of the wiring can not be deteriorated. However, since the p+ region layer 304 is formed in the base region, the withstand voltage may be lowered when this art is applied to an in-vehicle high breakdown voltage bipolar semiconductor device.

Moreover, in the above-mentioned prior art 2 and the prior art 3, since the surface of the semiconductor substrate is covered by the silicon nitride film having the high film stress, the element property variation due to the film stress generates. Particularly, when the prior arts 2 and 3 are applied to the bipolar semiconductor device shown in FIG. 14, malfunction may occur because $h_{FE}$ of a parasitic NPN transistor, which includes a junction separation layer including an embedded p-type layer 2 and a p-type separation diffusion layer 5 as a base, is increased, and the reliability of the bipolar semiconductor device is significantly decreased.

In the above-mentioned prior arts, the decrease of the field threshold voltage Vt due to the residual hydrogen in the plasma nitride film and the decrease of the effect to the bipolar transistor including the parasitic element can not be compatible. In addition, the decreasing of the reliability of the aluminum wiring and variation of the resistance value of the thin film resistor such as the metal or the metal silicide can not be suppressed.

SUMMARY OF THE INVENTION

It is an object of the present disclosure to provide a manufacturing method of a semiconductor device having a capacitor, a transistor and a diffusion resistor. It is another object of the present disclosure to provide a semiconductor device having a capacitor, a transistor and a diffusion resistor.

According to a first aspect of the present disclosure, a method for manufacturing a semiconductor device includes forming a capacitor, a transistor and a diffusion resistor in a p-type silicon substrate having a (111)-plane orientation and an off-set angle in a range between 3 degrees and 4 degrees; forming a junction separation layer for separating each of the capacitor, the transistor and the diffusion resistor in the substrate; forming a thermal oxide film over the substrate; forming a first opening in the thermal oxide film to expose the substrate; forming a CVD oxide film over the thermal oxide film and the exposed substrate; forming a second opening corresponding to the first opening in the CVD oxide film to expose the substrate; forming a first silicon oxide film by thermal oxidation over the exposed portion of the substrate via the second opening; forming a first silicon nitride film by low pressure CVD over the CVD oxide film, the first silicon oxide film and a sidewall of the second opening, and over the junction separation layer via the thermal oxide film and the CVD oxide film; removing a portion of the first silicon nitride film in the second opening to expose the first silicon oxide film; forming a third opening in the first silicon nitride film to expose the CVD oxide film over the junction separation layer together with the removing the portion of the first silicon nitride film; forming a second silicon oxide film by low pressure CVD over the exposed portion of the first silicon oxide film, the first silicon nitride film and in the third opening; etching a region of the first silicon oxide film and the second silicon oxide film, the region in which the first silicon oxide film and the second silicon oxide film are directly contacted, so that a contact hole to reach the substrate is formed; forming a wiring including aluminum in the contact hole; and forming a second silicon nitride film by plasma CVD as a protecting film over the wiring. A thickness of each of the first silicon oxide film, the first silicon nitride film and the second silicon oxide film is smaller than a thickness of each of the thermal oxide film and the CVD oxide film.

According to the above configuration, the high reliability semiconductor device having the capacitor, the transistor and the diffusion resistor can be obtained.

According to a second aspect of the present disclosure, a method for manufacturing a semiconductor device includes forming a capacitor, a transistor and a diffusion resistor in a p-type silicon substrate having a (111)-plane orientation and an off-set angle in a range between 3 degrees and 4 degrees; forming a junction separation layer for separating each of the capacitor, the transistor and the diffusion resistor in the substrate; forming a thermal oxide film over the substrate; forming a first opening in the thermal oxide film to expose the substrate; forming a CVD oxide film over the thermal oxide film and the exposed substrate; forming a second opening corresponding to the first opening in the CVD oxide film to expose the substrate; forming a first silicon oxide film by low pressure CVD over the exposed portion of the substrate via the second opening, the CVD oxide film and a sidewall of the second opening, and over the junction separation layer via the thermal oxide film and the CVD oxide film; forming a first silicon nitride film by low pressure CVD over the first silicon oxide film, and over the junction separation layer via the thermal oxide film, the CVD oxide film and the first silicon oxide film; removing a portion of the first silicon nitride film, the portion being in the second opening, to expose the first silicon oxide film; forming a third opening in the first silicon nitride film to expose the first silicon oxide film over the junction separation layer together with the removing the portion of the first silicon nitride film; forming a second silicon oxide film by low pressure CVD over the exposed portion of the first silicon oxide film, the first silicon nitride film and in the third opening; etching a region of the first silicon oxide film and the second silicon oxide film in the second opening, the region in which the first silicon oxide film and the second silicon oxide film are directly contacted, so that a contact hole to reach the substrate is formed; forming a wiring including aluminum in the contact hole; and forming a second silicon nitride film by plasma CVD as a protecting film over the wiring. A thickness of each of the first silicon oxide film, the first silicon nitride film and the second silicon oxide film is smaller than a thickness of each of the thermal oxide film and the CVD oxide film.

According to the above configuration, the high reliability semiconductor device having the capacitor, the transistor and the diffusion resistor can be obtained.

According to a third aspect of the present disclosure, a method for manufacturing a semiconductor device includes forming a capacitor, a transistor and a diffusion resistor in a p-type silicon substrate having a (111)-plane orientation and an off-set angle in a range between 3 degrees and 4 degrees; forming a junction separation layer for separating each of the capacitor, the transistor and the diffusion resistor in the substrate; forming a thermal oxide film over the substrate; forming a first opening in the thermal oxide film to expose the substrate; forming a CVD oxide film over the thermal oxide film and the exposed substrate; forming a second opening corresponding to the first opening in the CVD oxide film to expose the substrate; forming a first silicon oxide film by thermal oxidation over the exposed portion of the substrate via the second opening; forming a first silicon nitride film by low pressure CVD over the CVD oxide film, the first silicon oxide film and a sidewall of the second opening, and over the junction separation layer via the thermal oxide film and the CVD oxide film; removing a portion of the first silicon nitride film in the second opening to expose the first silicon oxide film; forming a third opening in the first silicon nitride film to expose the CVD oxide film over the junction separation layer together with the removing the portion of the first silicon nitride film; forming a second silicon oxide film by low pressure CVD over the exposed portion of the first silicon oxide film, the first silicon nitride film and in the third opening; forming a barrier film made of at least one of refractory metal and refractory metal alloy over the junction separation layer via the second silicon oxide film; forming at least one of an aluminum film and an aluminum alloy film over the barrier film; forming a third silicon oxide film by plasma CVD over the second silicon oxide film, and over the junction separation layer via the at least one of the aluminum film and the aluminum alloy film; etching a region of the first silicon oxide film, the second silicon oxide film and the third silicon oxide film, the region in which the first silicon oxide film, the second silicon oxide film and the third silicon oxide film are directly coupled, so that a contact hole to reach the substrate is formed; forming a via hole in the third silicon oxide film and over the junction separation layer, the via hole reaching the at least one of the aluminum film and the aluminum alloy film together with the etching the region; forming a wiring including aluminum in the contact hole and the via hole; and forming a second silicon nitride film by plasma CVD as a protecting film over the wiring. A thickness of each of the first silicon oxide film, the first silicon nitride film and the second silicon oxide film is smaller than a thickness of each of the thermal oxide film and the CVD oxide film.

According to the above configuration, the high reliability semiconductor device having the capacitor, the transistor and the diffusion resistor can be obtained.

According to a fourth aspect of the present disclosure, a method for manufacturing a semiconductor device includes forming a capacitor, a transistor and a diffusion resistor in a p-type silicon substrate having a (111)-plane orientation and an off-set angle in a range between 3 degrees and 4 degrees; forming a junction separation layer for separating each of the capacitor, the transistor and the diffusion resistor in the substrate; forming a thermal oxide film over the substrate; forming a first opening in the thermal oxide film to expose the substrate; forming a CVD oxide film over the thermal oxide film and the exposed substrate; forming a second opening corresponding to the first opening in the CVD oxide film to expose the substrate; forming a first silicon oxide film by low pressure CVD over the exposed portion of the substrate via the second opening, the CVD oxide film and a sidewall of the second opening, and over the junction separation layer via the thermal oxide film and the CVD oxide film; forming a first silicon nitride film by low pressure CVD over the first silicon oxide film, and over the junction separation layer via the thermal oxide film, the CVD oxide film and the first silicon oxide film; removing a portion of the first silicon nitride film, the portion being in the second opening, to expose the first silicon oxide film; forming a third opening in the first silicon nitride film to expose the first silicon oxide film over the junction separation layer together with the removing the portion of the first silicon nitride film; forming a second silicon oxide film by low pressure CVD over the exposed portion of the first silicon oxide film, the first silicon nitride film and in the third opening; forming a barrier film made of at least one of refractory metal and refractory metal alloy over the junction separation layer via the second silicon oxide film; forming at least one of an aluminum film and an aluminum alloy film over the barrier film; forming a third silicon oxide film by plasma CVD over the second silicon oxide film, and over the junction separation layer via the at least one of the aluminum film and the aluminum alloy film; etching a region of the first silicon oxide film, the second silicon oxide film and the third silicon oxide film, the region in which the first silicon oxide film, the second silicon oxide film and the third silicon oxide film are directly coupled, so that a contact hole to reach the substrate is formed; forming a via hole in the third silicon oxide film and over the junction separation layer, the via hole reaching the at least the aluminum film and the aluminum alloy film together with the etching the region; forming a wiring including aluminum in the contact hole and the via hole; and forming a second silicon nitride film by plasma CVD as a protecting film over the wiring. A thickness of each of the first silicon oxide film, the first silicon nitride film and the second silicon oxide film is smaller than a thickness of each of the thermal oxide film and the CVD oxide film.

According to the above configuration, the high reliability semiconductor device having the capacitor, the transistor and the diffusion resistor can be obtained.

According to a fifth aspect of the present disclosure, a method for manufacturing a semiconductor device includes forming a capacitor, a transistor and a diffusion resistor in a p-type silicon substrate having a (111)-plane orientation and an off-set angle in a range between 3 degrees and 4 degrees; forming a junction separation layer for separating each of the capacitor, the transistor and the diffusion resistor in the substrate; forming a thermal oxide film over the substrate; forming a first opening in the thermal oxide film to expose the substrate; forming a CVD oxide film over the thermal oxide film and the exposed substrate; forming a second opening corresponding to the first opening in the CVD oxide film to expose the substrate; forming a first silicon oxide film by thermal oxidation over the exposed portion of the substrate via the second opening; forming a first silicon nitride film by low pressure CVD over the CVD oxide film, the first silicon oxide film and a sidewall of the second opening, and over the junction separation layer via the thermal oxide film and the CVD oxide film; removing a portion of the first silicon nitride film in the second opening to expose the first silicon oxide film; forming a third opening in the first silicon nitride film to expose the CVD oxide film over the junction separation layer together with the removing the portion of the first silicon nitride film; forming a second silicon oxide film by low pressure CVD over the exposed portion of the first silicon oxide film, the first silicon nitride film and in the third opening; forming a resistive thin film made of at least one of metal and metal silicide over the junction separation layer via the second silicon oxide film; forming a barrier film made of at least one of refractory metal and refractory metal alloy over the resistive thin film; forming at least one of an aluminum film and an aluminum alloy film over the barrier film; forming a third silicon oxide film by plasma CVD over the second silicon oxide film, and over the junction separation layer via the at least one of the aluminum film and the aluminum alloy film; etching a region of the first silicon oxide film, the second silicon oxide film and the third silicon oxide film, the region in which the first silicon oxide film, the second silicon oxide film and the third silicon oxide film are directly coupled, so that a contact hole to reach the substrate is formed; forming a via hole in the third silicon oxide film and over the junction separation layer, the via hole reaching the at least one of the aluminum film and the aluminum alloy film together with the etching the region; forming a wiring including aluminum in the contact hole and the via hole; and forming a second silicon nitride film by plasma CVD as a protecting film over the wiring. A thickness of each of the first silicon oxide film, the first silicon nitride film and the second silicon oxide film is smaller than a thickness of each of the thermal oxide film and the CVD oxide film.

According to the above configuration, the high reliability semiconductor device having the capacitor, the transistor and the diffusion resistor can be obtained.

According to a sixth aspect of the present disclosure, a method for manufacturing a semiconductor device includes forming a capacitor, a transistor and a diffusion resistor in a p-type silicon substrate having a (111)-plane orientation and an off-set angle in a range between 3 degrees and 4 degrees; forming a junction separation layer for separating each of the capacitor, the transistor and the diffusion resistor in the substrate; forming a thermal oxide film over the substrate; forming a first opening in the thermal oxide film to expose the substrate; forming a CVD oxide film over the thermal oxide film and the exposed substrate; forming a second opening corresponding to the first opening in the CVD oxide film to expose the substrate; forming a first silicon oxide film by low pressure CVD over the exposed portion of the substrate via the second opening, the CVD oxide film and a sidewall of the second opening, and over the junction separation layer via the thermal oxide film and the CVD oxide film; forming a first silicon nitride film by low pressure CVD over the first silicon oxide film, and over the junction separation layer via the thermal oxide film, the CVD oxide film and the first silicon oxide film; removing a portion of the first silicon nitride film, the portion being in the second opening, to expose the first silicon oxide film; forming a third opening in the first silicon nitride film to expose the first silicon oxide film over the junction separation layer together with the removing the portion of the first silicon nitride film; forming a second silicon oxide film by low pressure CVD over the exposed portion of the first silicon oxide film, the first silicon nitride film and in the third opening; forming a resistive thin film made of at least one of metal and metal silicide over the junction separation layer via the second silicon oxide film; forming a barrier film made of at least one of refractory metal and refractory metal alloy over the resistive thin film; forming at least one of an aluminum film and an aluminum alloy film over the barrier film; forming a third silicon oxide film by plasma CVD over the second silicon oxide film, and over the junction separation layer via the at least one of the aluminum film and the aluminum alloy film; etching a region of the first silicon oxide film, the second silicon oxide film and the third silicon oxide film in the second opening, the region in which the first silicon oxide film, the second silicon oxide film and the third silicon oxide film are directly coupled, so that a contact hole to reach the substrate is formed; forming a via hole in the third silicon oxide film and over the junction separation layer, the via hole reaching the at least the aluminum film and the aluminum alloy film together with the etching the region; forming a wiring including aluminum in the contact hole and the via hole; and forming a second silicon nitride film by plasma CVD as a protecting film over the wiring. A thickness of each of the first silicon oxide film, the first silicon nitride film and the second silicon oxide film is smaller than a thickness of each of the thermal oxide film and the CVD oxide film.

According to the above configuration, the high reliability semiconductor device having the capacitor, the transistor and the diffusion resistor can be obtained.

According to a seventh aspect of the present disclosure, a semiconductor device includes a p-type silicon substrate having a (111)-plane orientation and an off-set angle in a range between 3 degrees and 4 degrees; a capacitor, a transistor and a diffusion resistor in the substrate; a junction separation layer disposed in the substrate for separating each of the capacitor, the transistor and the diffusion resistor; a laminated layer including a thermal oxide film and a CVD oxide film over the substrate; a first trench penetrating the laminated layer and reaching the substrate; a first silicon oxide film over a bottom surface of the first trench; a first silicon nitride film over the laminated layer, a sidewall of the first trench, and a first portion of the first silicon oxide film; a second trench penetrating the first silicon nitride film over the junction separation layer; a second silicon oxide film over the first silicon nitride film, a second portion of the first silicon oxide film and in the second trench; a contact hole reaching the substrate arranged in a region of the first silicon oxide film and the second silicon oxide film, the region in which the first silicon oxide film and the second silicon oxide film are directly contacted; a wiring including aluminum in the contact hole; and a second silicon nitride film as a protecting film over the wiring. A thickness of each of the first silicon oxide film, the first silicon nitride film and the second silicon oxide film is smaller than a thickness of each of the thermal oxide film and the CVD oxide film.

According to the above configuration, the high reliability semiconductor device having the capacitor, the transistor and the diffusion resistor can be obtained.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
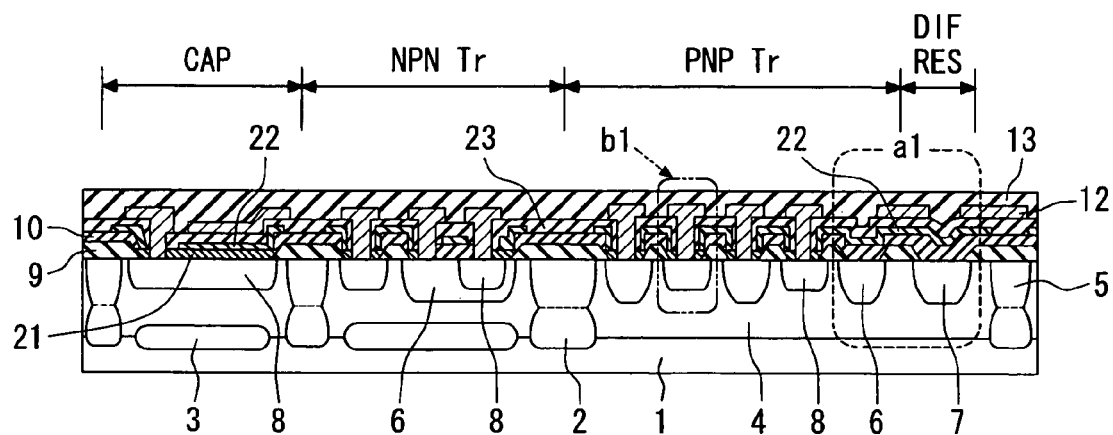
FIG. 1 is a cross sectional view showing a semiconductor device according to a first embodiment.
Figure 2:
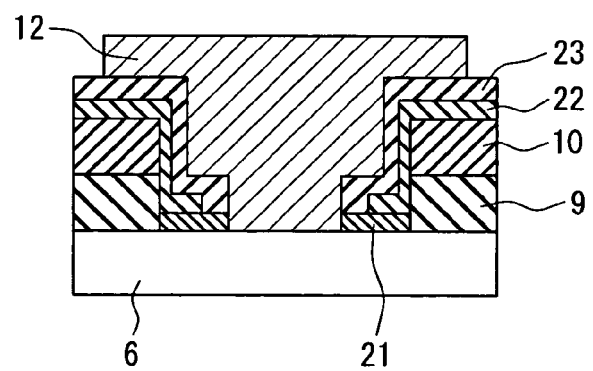
FIG. 2 is an enlarged view of a contact portion by in FIG. 1.

Next, a first embodiment of the present disclosure will be described with reference to FIGS. 1 and 2. FIGS. 1 and 2 are structural cross sectional views showing a semiconductor device. As shown in FIG. 1, an embedded p-type layer 2 and an embedded n-type layer 3 are formed in a p-type substrate 1 having a (111)-plane orientation and an off-set angle in a range between 3 degrees and 4 degrees, and then, an n-type epitaxial layer 4 is formed. A p-type junction separation layer including the embedded p-type layer 2 and a p-type separation diffusion layer 5, a p-type diffusion layer 6, a p-type diffusion resistor layer 7 and an n-type diffusion layer 8 are formed in the semiconductor substrate. After a thin silicon oxide film 21 is formed in a capacitor region and a bottom of a contact portion over the substrate, a thin silicon nitride film 22 is formed over a surface of the substrate by low pressure CVD, except surface portions of the bottom of a contact portion and the p-type separation diffusion layer 5. Moreover, a thin silicon oxide film 23 is formed over the surface of the substrate by low pressure CVD.

Thereafter, an aluminum wiring 12 is formed so as to cover the capacitor region and contact the p-type diffusion layer 6 and the n-type diffusion layer 8 via contact holes. A plasma silicon nitride film 13 is formed by plasma CVD to protect a surface of the aluminum wiring 12 so that a bipolar semiconductor device including a bipolar transistor, a p-type diffusion resistor and a capacitor can be obtained.

According to the first embodiment, the capacitor film has ONO structure including the thin silicon oxide film 21, the thin silicon nitride film 22 and the thin silicon oxide film 23. A parasitic MOS transistor portion shown by a1 in FIG. 1 has structures that a thick thermal oxide film 9 and a thick CVD film 10 are covered by the thin silicon nitride film 22, and that a portion of the thin silicon nitride film 22, under which the p-type separation diffusion layer 5 is formed, is removed. As shown in FIG. 2, only two layers, the thin silicon oxide film 21 and the thin silicon oxide film 23, are laminated at the bottom of the contact portion. An opening portion can be provided by wet etching and low contact resistance can be obtained in the opening portion.

Figure 11A:
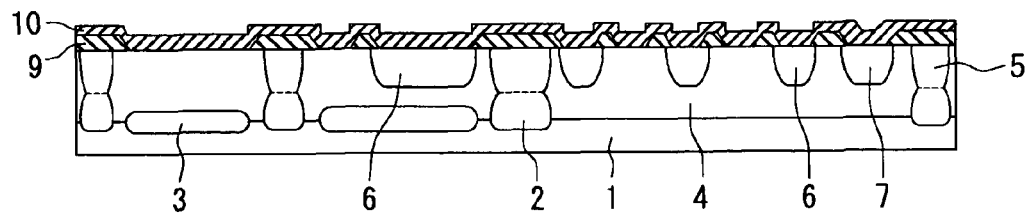
FIGS. 11A to 11E are cross sectional views showing manufacturing steps of the semiconductor device according to the first embodiment.
Figure 11B:
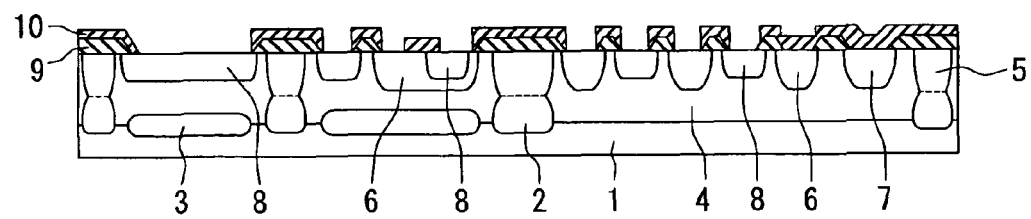
Figure 11C:
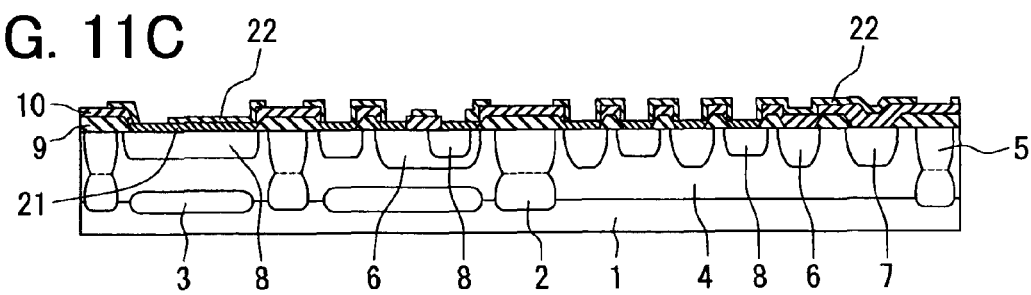

Next, a manufacturing method of the semiconductor device will be described with reference to a drawing. FIGS. 11A to 11E are views showing the manufacturing method of the semiconductor device. As shown in FIG. 11A, the embedded p-type layer 2 and the embedded n-type layer 3 are formed in the p-type substrate 1, which has a (111)-plane orientation and an off-set angle in a range between 3 degrees and 4 degrees, and then, the n-type epitaxial layer 4 is formed. The thick CVD oxide film 10 is formed over the semiconductor substrate in which the p-type junction separation layer including the embedded p-type layer 2 and the p-type separation diffusion layer 5, the p-type diffusion layer 6 and the p-type diffusion resistor layer 7. As shown is FIG. 11B, opening portions are formed in the thick CVD oxide layer 10. Phosphorous addition treatment is performed over the surface of the semiconductor substrate and thermal diffusion is performed so that the n-type diffusion layer 8 is formed. And then, as shown in FIG. 11C, unnecessary portions of the thick CVD oxide layer 10 in the capacitor region and portions in which contact holes are formed later are removed. At this time, dimensions of the removed region in the portions in which contact holes are formed later are larger than dimensions of the contact holes. The thin silicon oxide film 21 is formed by thermal oxidation, for example, and the thin silicon nitride film 22 is formed by low pressure CVD. And then, portions in which contact holes are formed later and an upper portion of the p-type separation diffusion layer 5 of the thin silicon nitride film 22 are removed. At this time, dimensions of the removed region in the portions in which contact holes are formed later are larger than dimensions of the contact holes.

Figure 11D:
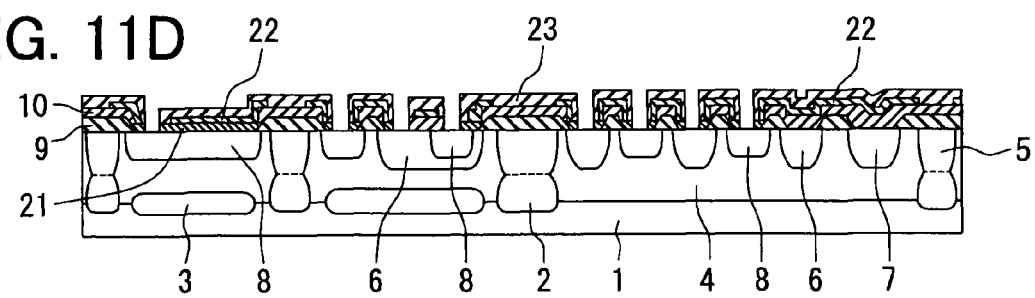
Figure 11E:
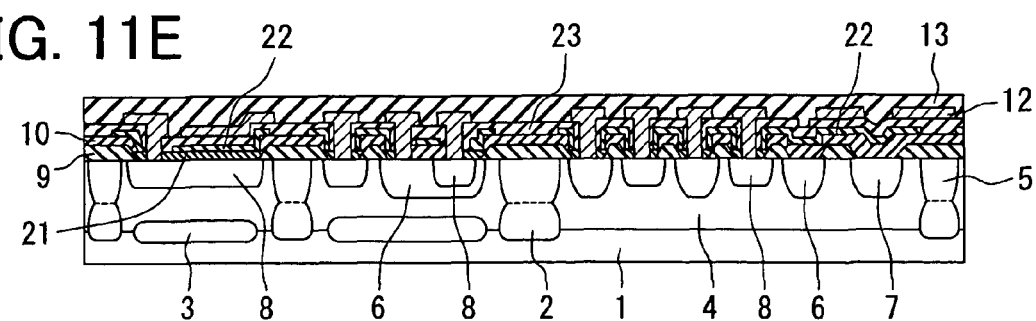

After that, as shown in FIG. 11D, the silicon oxide film 23 is formed by low pressure CVD using organic silicon compound such as TEOS as a main material. Since contact portions have laminated structures, that is, the thin silicon oxide film 21 and the thin silicon oxide film 23 formed by low pressure CVD are laminated as mentioned above, contact portions are formed by wet etching which can obtain low contact resistance. Moreover, as shown in FIG. 11E, the aluminum wiring 12 made of an aluminum alloy as a main material is formed, and then, the plasma silicon nitride film 13 is formed to protect the surface of the aluminum wiring 12. Thereby, the manufacturing of the semiconductor device according to the first embodiment is completed.

Figure 14:
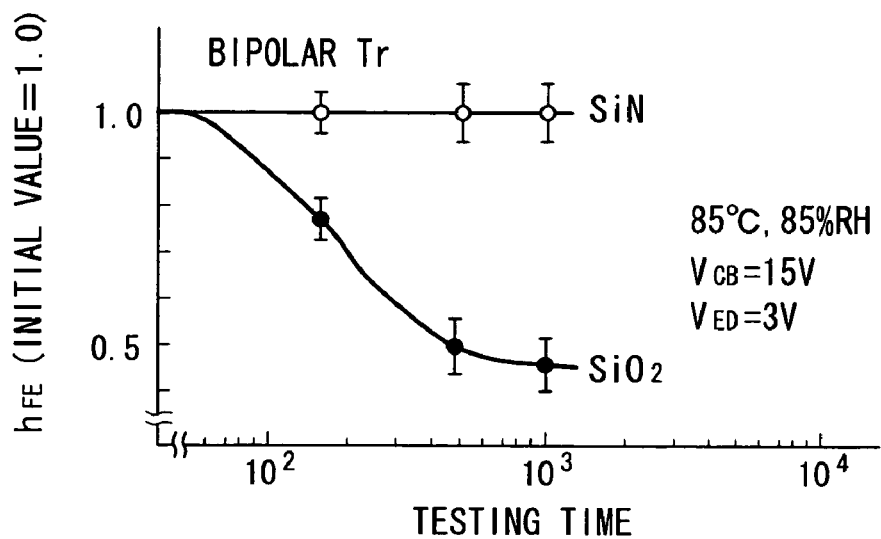
FIG. 14 is a graph showing variation correlation of $h_{FE}$ by a passivation film of a transistor.
Figure 15:
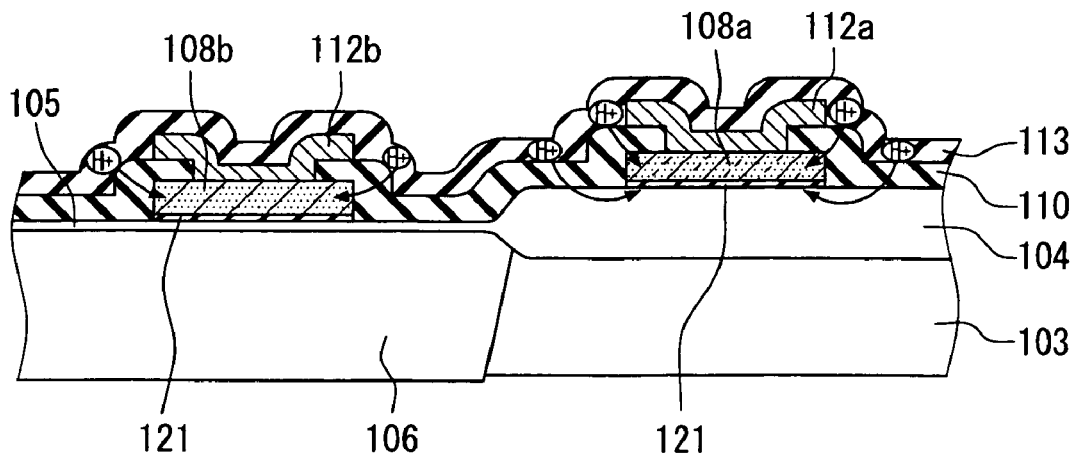
FIG. 15 is a cross sectional view showing a transistor.
Figure 16A:
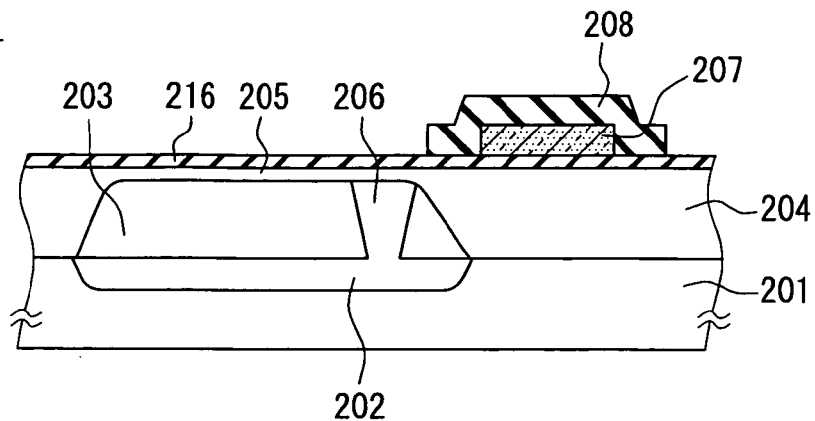
FIGS. 16A to 16C are cross sectional views showing various transistors.
Figure 16B:
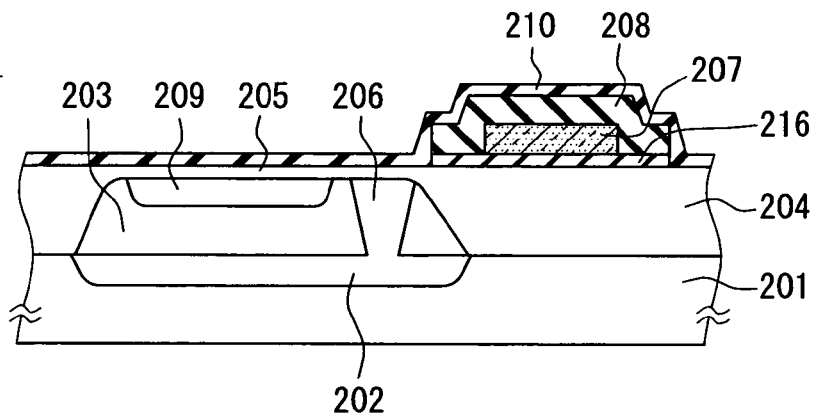
Figure 16C:
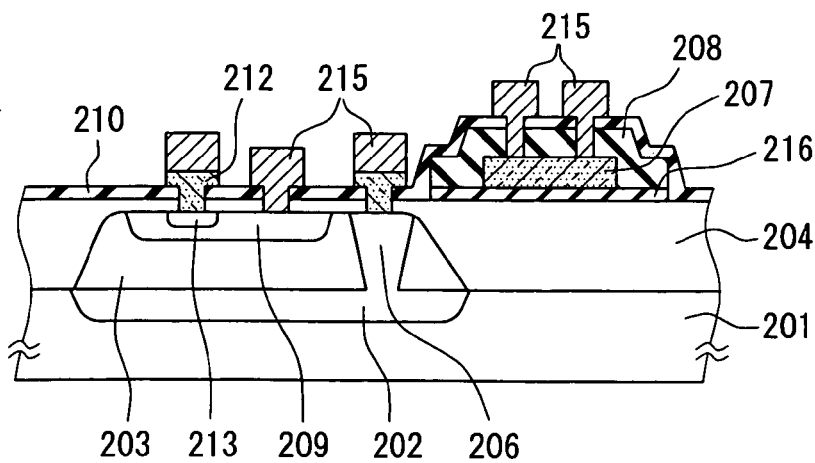
Figure 17:
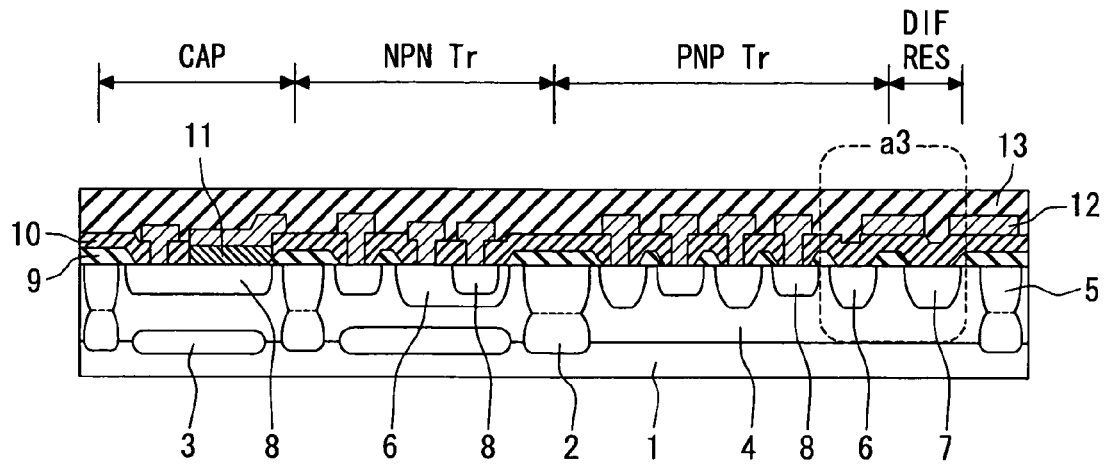
FIG. 17 is a cross sectional view showing a structure of a general bipolar transistor.
Figure 18:
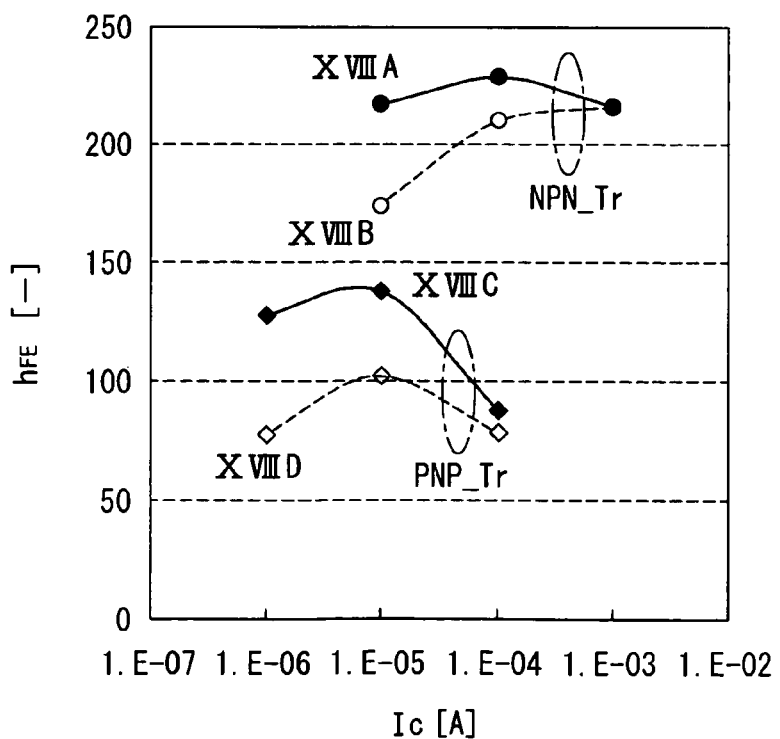
FIG. 18 is a graph showing an effect to element property of a plasma nitride silicon film.
Figure 19:
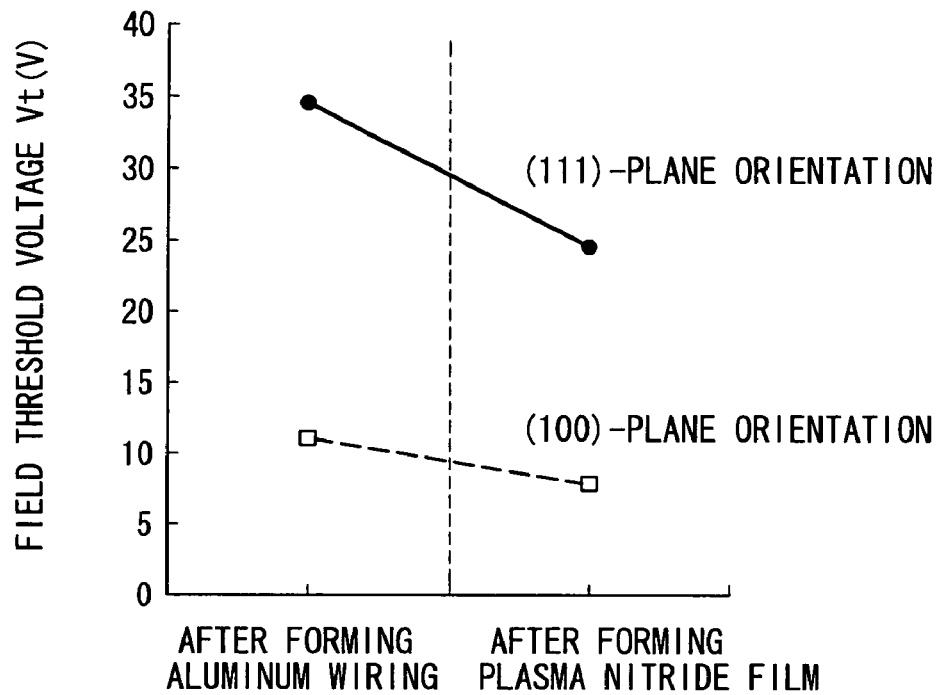
FIG. 19 is a graph showing an effect to parasitic element property of a plasma nitride silicon film.
Figure 20:
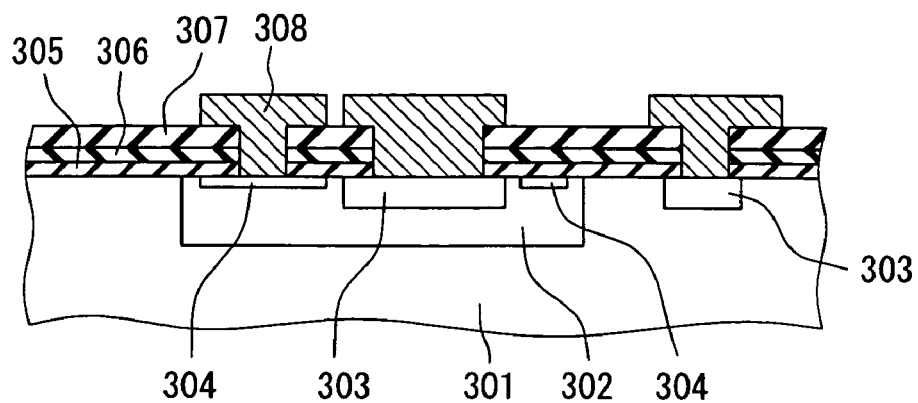
FIG. 20 is a cross sectional view showing a transistor.
Figure 21:
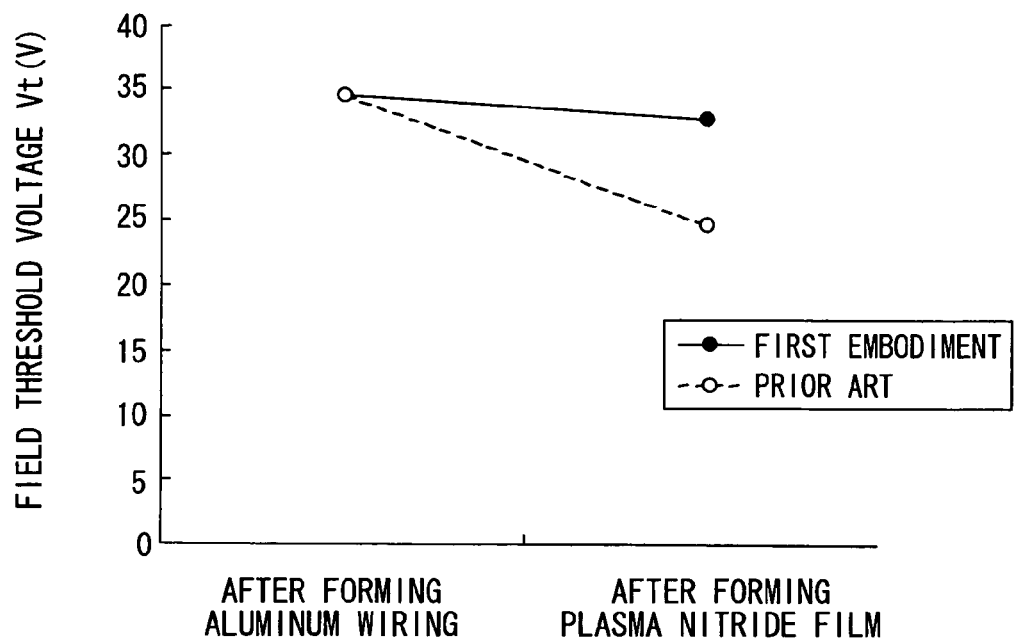
FIG. 21 is a graph showing lowering of field threshold voltage Vt.

The effect of the present disclosure with respect to the decreasing of the field threshold voltage Vt of the parasitic MOS due to the residual hydrogen in the plasma nitride film is shown in FIG. 21. In the semiconductor device of the prior art shown in FIG. 14, the field threshold voltage Vt of the parasitic MOS (a3 in FIG. 14) decreases about 10 V after forming the plasma nitride film. On the other hand, in the semiconductor device of the present disclosure, the field threshold voltage Vt of the parasitic MOS hardly decreases after forming the plasma nitride film, and the effect by the residual hydrogen in the plasma nitride film is suppressed sufficiently.

Figure 22:
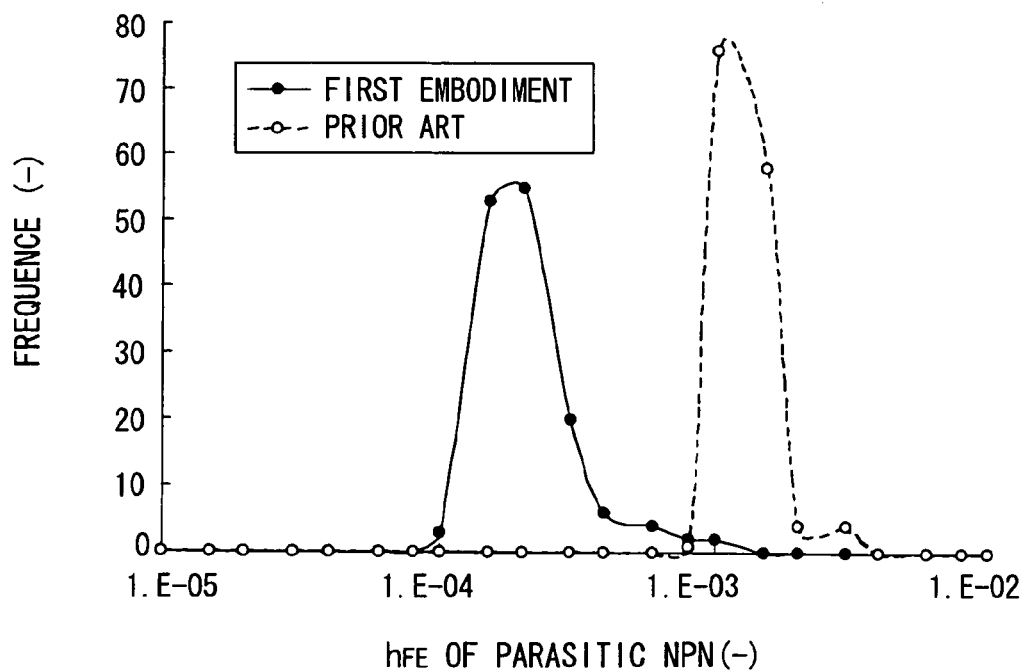
FIG. 22 is a comparative graph showing between an effect of the present disclosure and the prior art.

In addition, with respect to the covering the semiconductor substrate by the silicon nitride film by low pressure CVD, the effect of the present disclosure due to the film stress of the silicon nitride film is as follows. With respect to the above-mentioned $h_{FE}$ of the parasitic NPN transistor with the p-type junction separation layer as the base, a result compared with the semiconductor device of the prior art 2 is shown in FIG. 22. As shown in FIG. 22, $h_{FE}$ of the parasitic NPN transistor according to the semiconductor device of the present disclosure is suppressed sufficiently compared with $h_{FE}$ of the parasitic NPN transistor according to the semiconductor device of the prior art 2. Therefore, the semiconductor device according to the present disclosure has high breakdown voltage with respect to malfunction.

Second Embodiment

Figure 3:
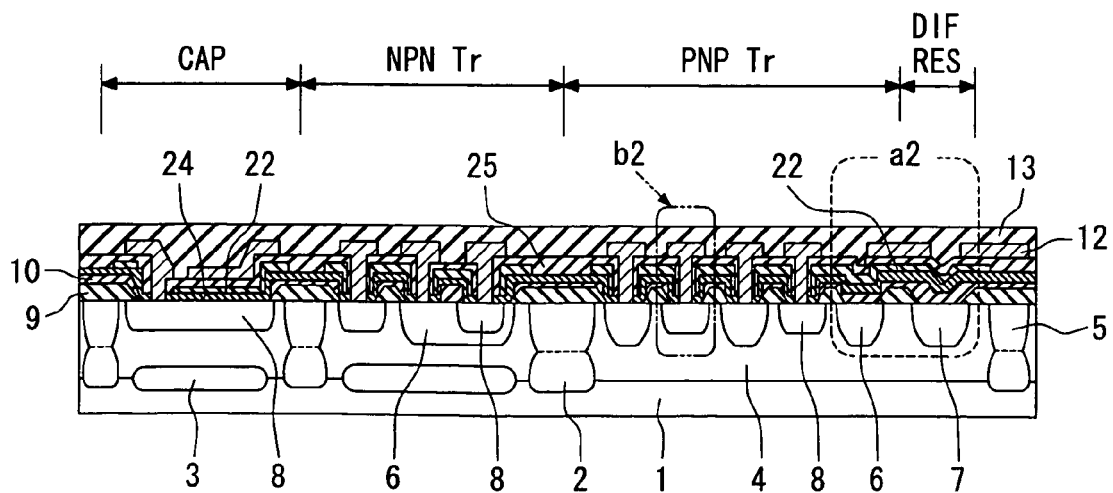
FIG. 3 is a cross sectional view showing a semiconductor device according to a second embodiment.
Figure 4:
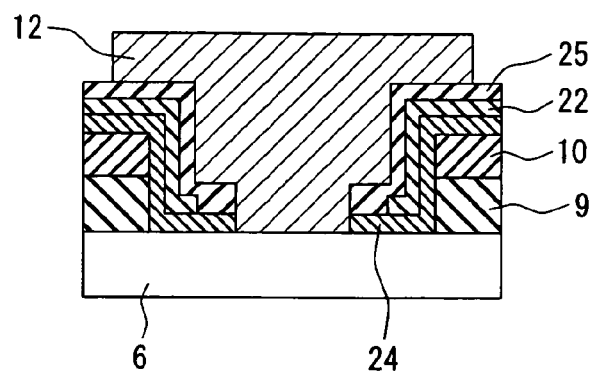
FIG. 4 is an enlarged view of a contact portion b2 in FIG. 3.

Next, a second embodiment of the present disclosure will be described with reference to FIGS. 3 and 4. As shown in FIG. 3, as well as the first embodiment, a thin lower silicon oxide film 24 is formed over a substrate in which a p-type junction separation layer including an embedded p-type layer 2 and a p-type separation diffusion layer 5, a p-type diffusion layer 6, a p-type diffusion resistor layer 7 and an n-type diffusion layer 8. After forming the thin lower silicon oxide film 24 in a capacitor region and a bottom of a contact portion by low pressure CVD, a thin silicon nitride film 22 is formed over the substrate by low pressure CVD except the bottom of the contact portion and a portion, under which the p-type separation diffusion layer 5 is formed. Moreover, a thin upper silicon oxide film 25 is formed to cover a surface of the substrate by low pressure CVD.

Thereafter, an aluminum wiring 12 is formed so as to cover the capacitor region and contact the p-type diffusion layer 6 and the n-type diffusion layer 8 via contact holes. A plasma silicon nitride film 13 is formed by plasma CVD to protect a surface of the aluminum wiring 12 so that a bipolar semiconductor device including a bipolar transistor, a p-type diffusion resistor and a capacitor can be obtained.

According to the second embodiment, the capacitor film has ONO structure including the thin lower silicon oxide film 24, the thin silicon nitride film 22 and the thin upper silicon oxide film 25. A parasitic MOS transistor portion shown by a2 in FIG. 3 has structures that a thick thermal oxide film 9 and a thick CVD film 10 are covered by the thin silicon nitride film 22, and that a portion of the thin silicon nitride film 22, under which the p-type separation diffusion layer 5 is formed, is removed. As shown in FIG. 4, only two layers, the thin lower silicon oxide film 24 and the thin upper silicon oxide film 25, are laminated at the bottom of the contact portion. An opening portion can be provided by wet etching, and low contact resistance can be obtained in the opening portion.

In a manufacturing method of the semiconductor device, the thin lower silicon oxide film 24 is formed over a surface of the substrate by low pressure CVD using organic silicon compound such as TEOS as a main material in place of the thin silicon oxide film 21 in FIG. 11C showing the manufacturing method according to the first embodiment. Thereafter, in a similar way to the first embodiment, the thin silicon nitride film 22 is formed over the substrate and portions in which contact holes are formed later and a portion of the thin silicon nitride film 22, under which the p-type separation diffusion layer 5 is formed, are removed. And then, the thin upper silicon oxide film 25 is formed by low pressure CVD using organic silicon compound such as TEOS as a main material.

Third Embodiment

Figure 5:
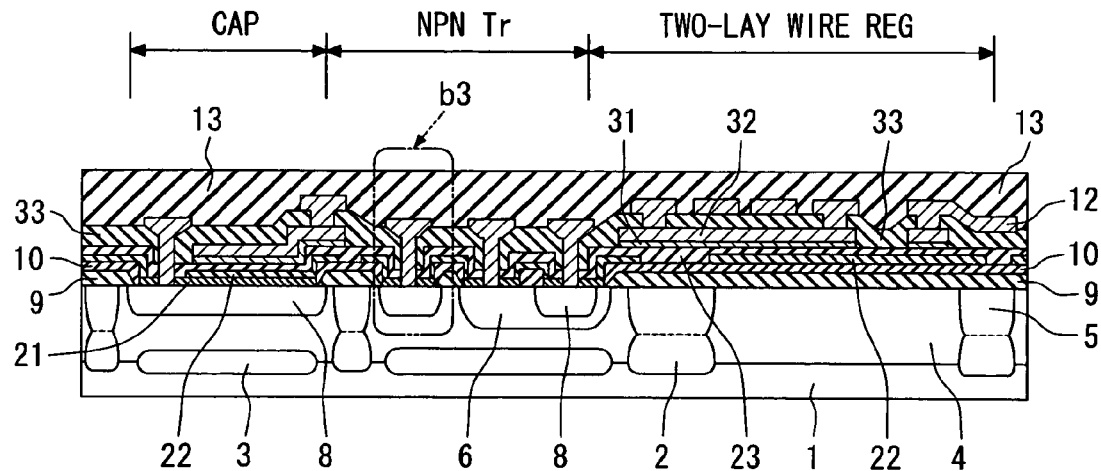
FIG. 5 is a cross sectional view showing a semiconductor device according to a third embodiment.

Next, a third embodiment of the present disclosure will be described with reference to FIGS. 5, 6, 7 and 12. As shown in FIG. 5, as well as the first embodiment, a thin silicon oxide film 21 is formed in a capacitor region and a bottom of a contact portion, and then, a thin silicon nitride film 22 is formed over a surface of a substrate by low pressure CVD except the bottom of the contact portion and a portion, under which the p-type separation diffusion layer 5 is formed. Moreover, a thin silicon oxide film 23 is formed by low pressure CVD so as to cover the substrate. And then, an aluminum film or an aluminum alloy film 32 is formed over the substrate through a barrier film 31 made of refractory metal or an alloy thereof. A two-layer film, that is, the barrier film 31 and the aluminum film or the aluminum alloy film 32, is processed to be a desired shape, and a plasma silicon oxide film 33 is formed by plasma CVD so as to cover the substrate. Moreover, after an aluminum wiring 12 is connected to the processed two-layer film through a via hole and connected to the n-type diffusion layer 8 through a contact hole, the plasma silicon nitride film 13 is formed by plasma CVD to protect a surface of the aluminum wiring 12 so that a bipolar semiconductor device including a bipolar transistor, a p-type diffusion resistor and a capacitor can be obtained.

Figure 6:
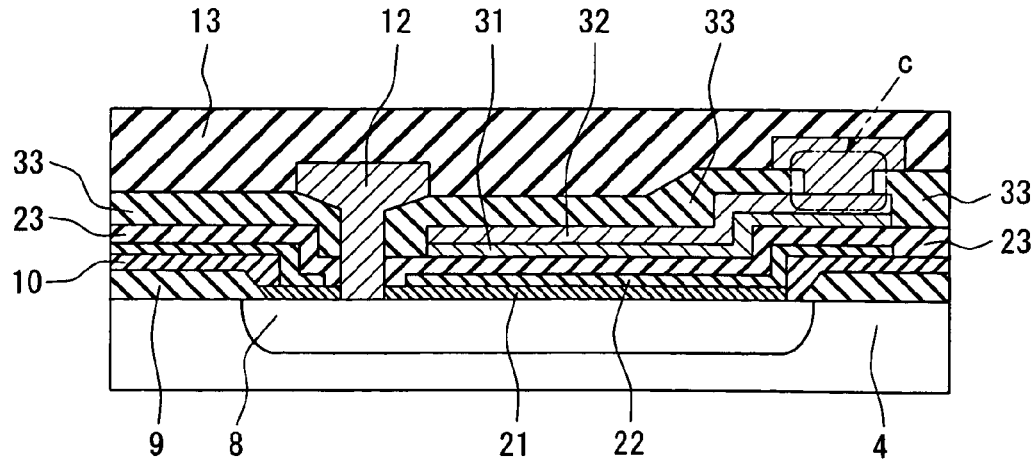
FIG. 6 is an enlarged view of a capacitor portion in FIG. 5.

According to the third embodiment, as shown in FIG. 6, the capacitor film has ONO structure including the thin silicon oxide film 21, the thin silicon nitride film 22 formed by low pressure CVD and the thin silicon oxide film 23 as well as the first embodiment. In addition, an upper electrode of the capacitor is the two-layer film including the barrier film 31 and the aluminum film or the aluminum alloy film 32. Thereby, the reliability of the semiconductor device can be increased.

In a field portion, a parasitic MOS transistor region is covered by the thin silicon nitride film 22 so that the decreasing of the field threshold voltage Vt due to residual hydrogen can be suppressed. Moreover, by using the two-layer film as a lower wiring and the aluminum wiring 12 as an upper wiring (i.e., a two-layer wiring structure), the wiring efficiency can be increased.

Figure 7:
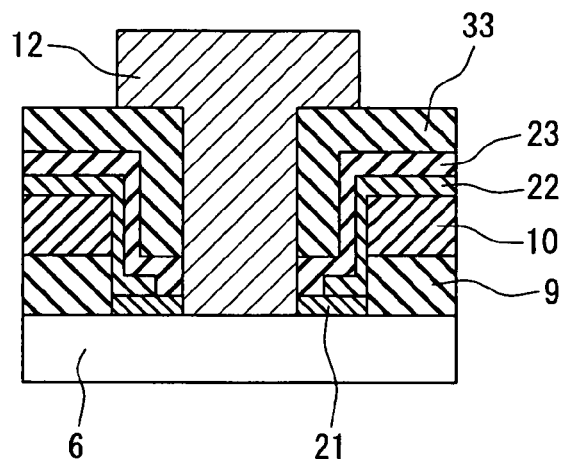
FIG. 7 is an enlarged view of a contact portion b3 in FIG. 5.

In addition, as shown in FIG. 7, only two layers, the thin silicon oxide film 21 and the thin silicon oxide film 23 formed by low pressure CVD, are laminated in the bottom of the contact portion as well as the first embodiment. An opening portion can be provided by wet etching and low contact resistance can be obtained in the opening portion.

Figure 12A:
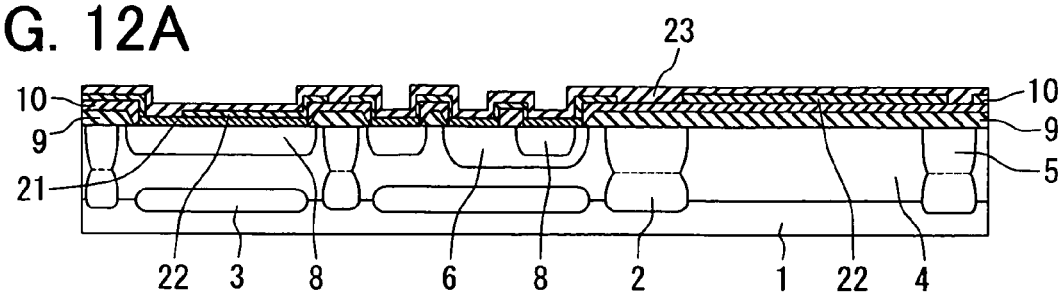
FIGS. 12A to 12E are cross sectional views showing manufacturing steps of the semiconductor device according to the third embodiment.
Figure 12B:
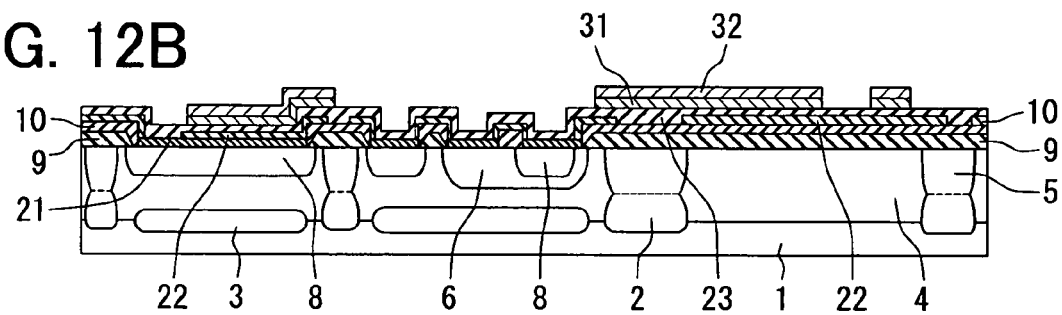

Next, a manufacturing method of the semiconductor device will be described with reference to FIGS. 12A to 12E. As shown in FIG. 12A, as well as the manufacturing method according to the first embodiment, a thin silicon nitride film 22 is formed by low pressure CVD to cover the surface of the semiconductor substrate except a portion in which a contact hole is formed and a surface portion, under which the p-type separation diffusion layer 5 is formed. And then, a silicon oxide film 23 is formed by low pressure CVD using organic silicon compound such as TEOS as a main material over the surface of the semiconductor substrate. After forming the silicon oxide film 23, as shown in FIG. 12B, an aluminum film or an aluminum alloy film 32 is formed through a barrier film 31 made of refractory metal or an alloy thereof, for example, titanium or a titanium-tungsten alloy. After that, a two-layer film, the barrier film 31 and the aluminum film or the aluminum alloy film 32, is processed to be a desired shape, in which the two-layer film is used as at least an upper electrode of the capacitor and a lower wiring.

Figure 12C:
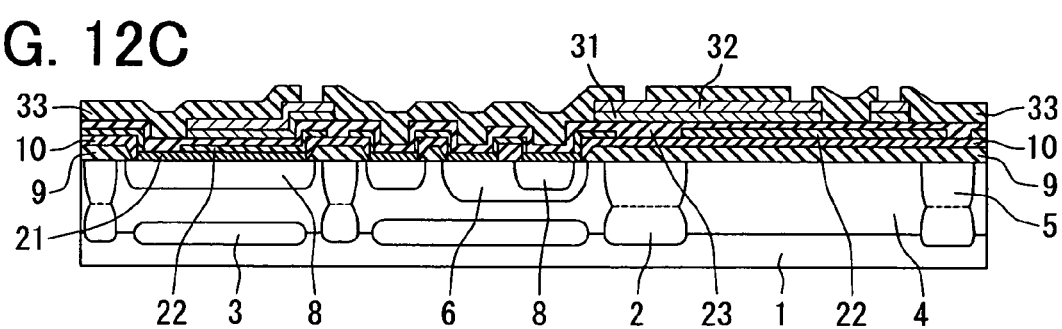

As shown in FIG. 12C, after a plasma silicon oxide film 33 is formed by plasma CVD to cover the substrate, a via hole for contacting the two-layer film is provided in the plasma silicon oxide film 33. Thereby, the two-layer film, which is processed to be a desired shape, becomes a part of a desired circuit.

Figure 12D:
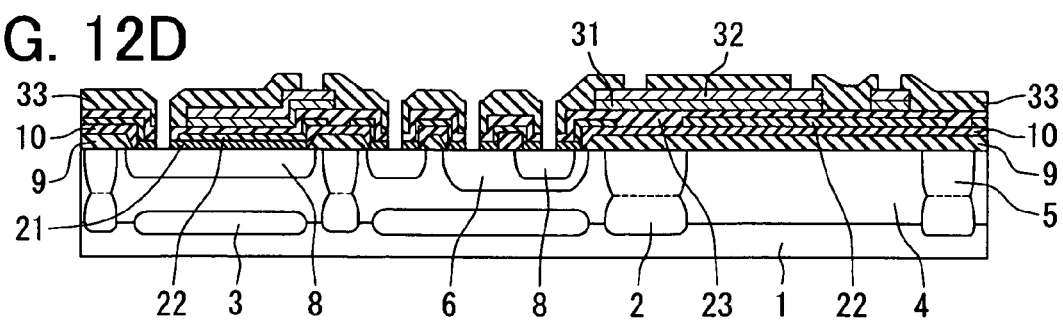
Figure 12E:
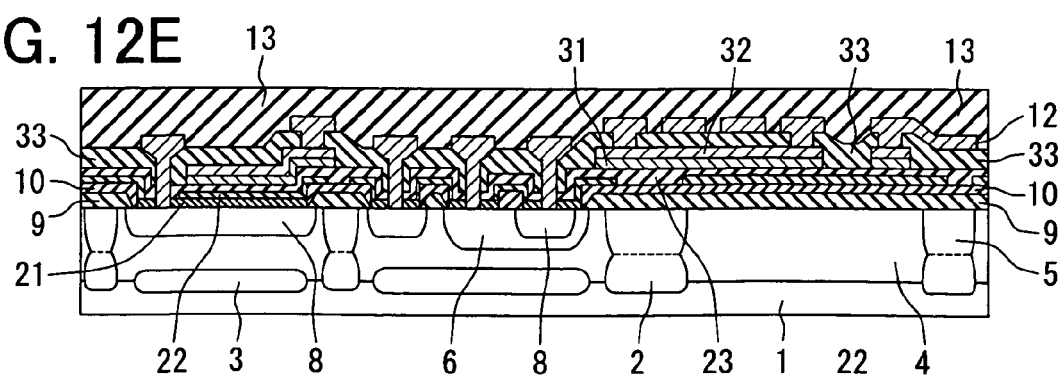

Further, as shown in FIG. 12D, since contact portions have laminated structures, that is, the thin silicon oxide film 21 formed by thermal oxidation and the thin silicon oxide film 23 formed by low pressure CVD are laminated as mentioned above, contact portions are formed by wet etching which can obtain low contact resistance, for example. After that, as shown in FIG. 12E, an aluminum wiring 12 made of an aluminum alloy as a main material is formed, and a plasma silicon nitride film 13 is formed to protect the surface of the semiconductor substrate. Thereby, the manufacturing of the semiconductor device according to the present embodiment is completed.

Fourth Embodiment

A fourth embodiment is a combination of the second embodiment and the third embodiment. In the fourth embodiment, in the capacitor, the capacitor film has ONO structure including the thin lower silicon oxide film 24, the thin silicon nitride film 22 and the thin upper silicon oxide film 25 as well as the second embodiment, and an upper electrode is the two-layer film including the barrier film 31 and the aluminum film or the aluminum alloy film 32 as well as the third embodiment.

In addition, in a field portion of the fourth embodiment, a parasitic MOS transistor region is covered by the thin silicon nitride film 22 and by using the two-layer wirings structure in which the two-layer film as a lower wiring and the aluminum wiring 12 as an upper wiring, the wiring efficiency can be increased.

Moreover, in the manufacturing method according to the present embodiment, a thin upper silicon oxide film 25 is formed over the surface of the substrate by low pressure CVD by the manufacturing method according to the second embodiment. After that, the two-layer film including the barrier film 31 and the aluminum film or the aluminum alloy film 32 is formed. The two-layer film is processed to be a desired shape, and a via hole for connecting the two-layer film is formed so that the two-layer film becomes a part of a desired circuit. And then, a contact hole is formed, the aluminum wiring 12 is formed, and the plasma silicon nitride film 13 is formed to protect the surface of the semiconductor substrate. Thereby, the manufacturing of the semiconductor device according to the present embodiment is completed.

Fifth Embodiment

Figure 8:
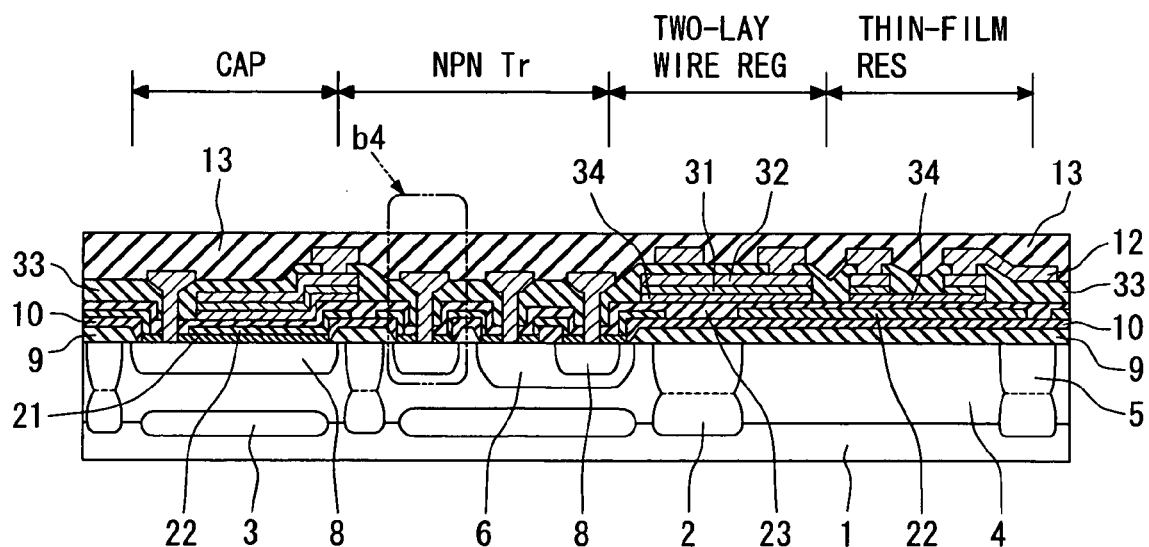
FIG. 8 is a cross sectional view showing a semiconductor device according to a fifth embodiment.
Figure 9:
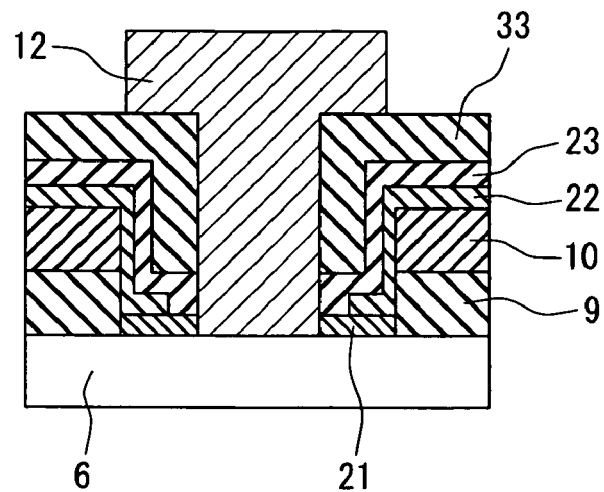
FIG. 9 is an enlarged view of a contact portion b4 in FIG. 8.

Next, a fifth embodiment of the present disclosure will be described with reference to FIGS. 8, 9 and 10. As shown in FIG. 8, in the fifth embodiment, as well as the first embodiment, a thin silicon oxide film 21 is formed in a capacitor region and a bottom of a contact portion, and then, a thin silicon nitride film 22 is formed over a surface of a substrate by low pressure CVD except the bottom of the contact portion and a surface portion, under which the p-type separation diffusion layer 5 is formed. Moreover, a thin silicon oxide film 23 is formed by low pressure CVD so as to cover the substrate. A resistive thin film 34 including a metal or a metal silicide, with an aluminum film or an aluminum alloy film 32 arranged at an end portion thereof through a barrier film 31, is formed over the semiconductor substrate, and then, a plasma silicon oxide film 33 is formed by plasma CVD so as to cover the surface of the substrate. The aluminum wiring 12 is connected to the resistive thin film 34 through the via hole to obtain a desired circuit and the aluminum wiring 12 is connected to the n-type diffusion layer 8 formed in the substrate through a contact hole. After that, the plasma silicon nitride film 13 is formed by plasma CVD to protect the surface of the aluminum wiring 12 so that a bipolar semiconductor device including a bipolar transistor, a p-type diffusion resistor and a capacitor can be obtained.

According to the fifth embodiment, the capacitor film has ONO structure including the thin silicon oxide film 21, the thin silicon nitride film 22 formed by low pressure CVD and the thin silicon oxide film 23 formed by low pressure CVD as well as the first embodiment, and a parasitic MOS transistor portion is covered by the thin silicon nitride film 22. In addition, as shown in FIG. 9, only two layers, that is, the thin silicon oxide film 21 and the thin silicon oxide film 23, are laminated at the bottom of the contact portion. An opening portion can be provided by wet etching and low contact resistance can be obtained in the opening portion.

Figure 10:
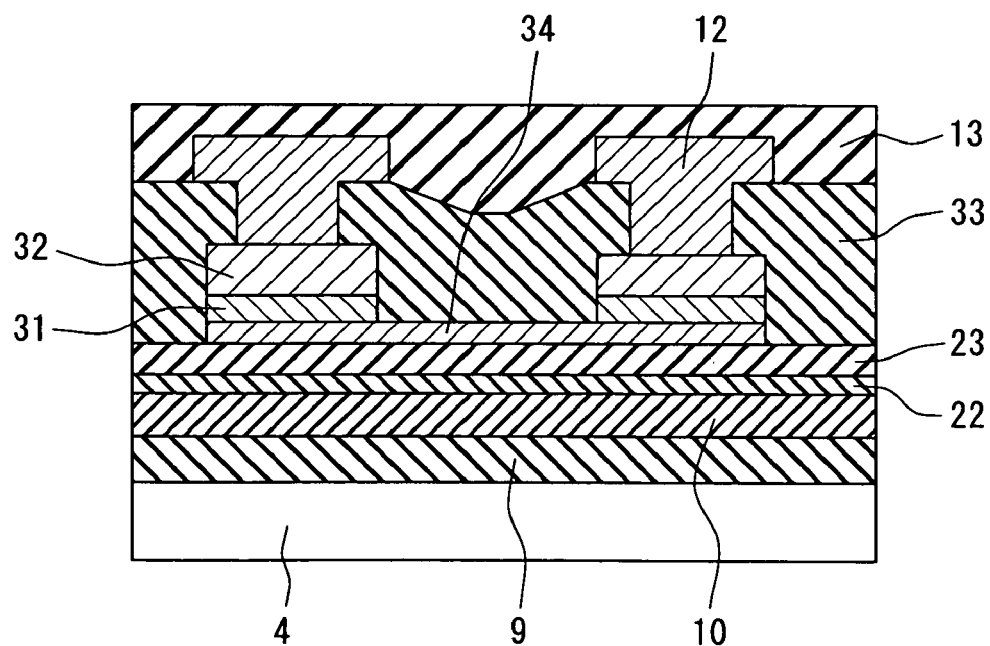
FIG. 10 is an enlarged view of a thin film resistor in FIG. 8.

Moreover, as shown in FIG. 10, since the resistive thin film 34 is protected by the thin silicon oxide film 23 and the plasma silicon oxide film 33, an effect of the film stress of each of the thin silicon nitride film 22 formed in a lower layer and the plasma silicon oxide film 13 formed in an upper layer to the resistive thin film 34 can be decreased.

Figure 13A:
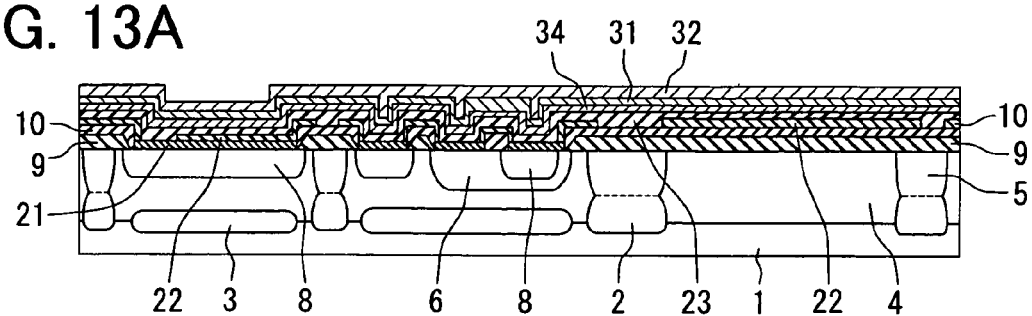
FIGS. 13A to 13E are cross sectional views showing manufacturing steps of the semiconductor device according to the fifth embodiment.

Next, a manufacturing method of the semiconductor device will be described with reference to FIGS. 13A to 13E. As shown in FIG. 13A, as well as the manufacturing method according to the first embodiment, a thin silicon nitride film 22 is formed by low pressure CVD to cover the surface of the semiconductor substrate except a portion in which a contact hole is formed and a surface portion, under which the p-type separation diffusion layer 5 is formed. And then, a silicon oxide film 23 is formed by low pressure CVD using organic silicon compound such as TEOS as a main material over the surface of the semiconductor substrate. After forming the silicon oxide film 23, a resistive thin film 34 including chromium silicon nitride formed by reactive sputtering using such as a metal or a metal silicide, a barrier film 31 including refractory metal or an alloy thereof, for example, titanium or a titanium-tungsten alloy, and an aluminum film or an aluminum alloy film 32 are formed sequentially.

Figure 13B:
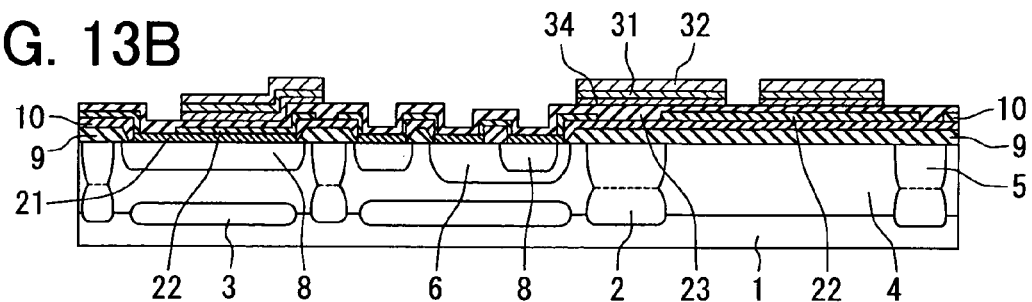

After that, as shown in FIG. 13B, a three-layer film, the resistive thin film 34, the barrier film 31 and the aluminum film or the aluminum alloy film 32, is processed to be a desired shape, in which the three-layer film is used as at least an upper electrode of the capacitor, a lower wiring of a two-layer wiring region and a thin film resistor.

Figure 13C:
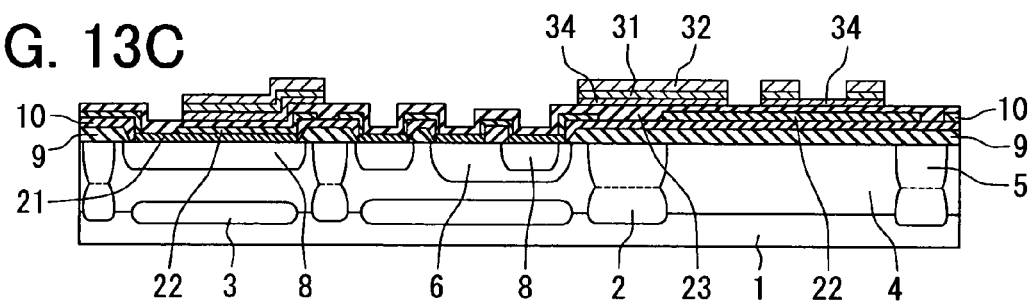

As shown in FIG. 13C, the barrier film 31 and the aluminum film or the aluminum alloy film 32 over the resistive thin film 34 are removed sequentially with portions thereof remaining for obtaining an electrical connection at end portions in the thin film resistor. In this case, it is desirable that the barrier film 31 and the aluminum film or the aluminum alloy 32 are removed by wet etching so as not to damage the resistive thin film 34.

Figure 13D:
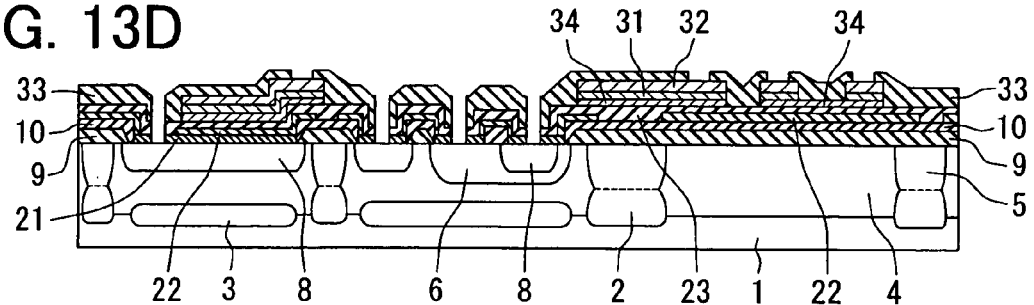

As shown in FIG. 13D, the substrate is covered by the plasma silicon oxide 33 by plasma CVD. After that, a via hole for contacting the three-layer film is provided, so that the three-layer film, which is processed to be a desired shape, becomes a part of a desired circuit. And then, since contact portions have laminated structures, that is, the thin silicon oxide film 21 formed by thermal oxidation and the thin silicon oxide film 23 formed by low pressure CVD are laminated as mentioned above, contact portions are formed by wet etching which can obtain low contact resistance, for example.

Figure 13E:
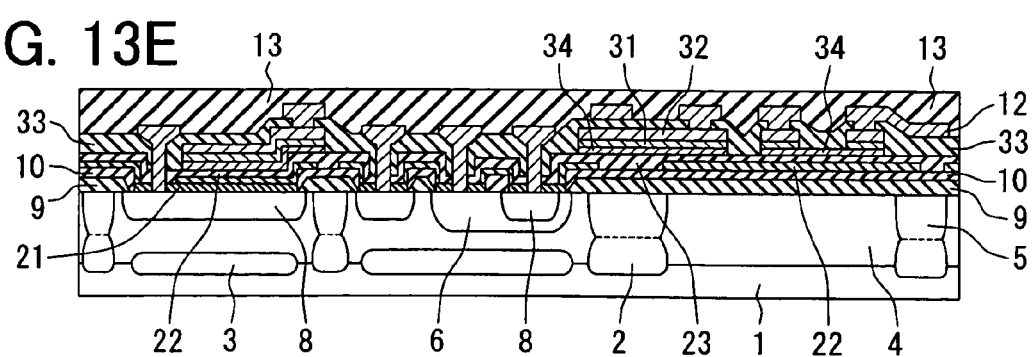

Finally, as shown in FIG. 13E, an aluminum wiring 12 made of an aluminum alloy as a main material is formed, and a plasma silicon nitride film 13 is formed to protect the surface of the semiconductor substrate. Thereby, the manufacturing of the semiconductor device according to the present embodiment is completed.

Sixth Embodiment

A sixth embodiment is a combination of the second embodiment and the fifth embodiment. In the sixth embodiment, the capacitor film has ONO structure including the thin lower silicon oxide film 24 formed by low pressure CVD, the thin silicon nitride film 22 formed by low pressure CVD and the thin upper silicon oxide film 25 by low pressure CVD as well as the second embodiment. Moreover, a parasitic MOS transistor portion has structures that a thick thermal oxide film 9 and a thick CVD film are covered by the thin silicon nitride film 22 and a portion of the thin silicon nitride film, under which the p-type separation diffusion layer is formed, is removed. In addition, only two layers, the thin lower silicon oxide film and the thin upper silicon oxide film are laminated in the bottom of the contact portion and an opening portion can be provided by wet etching and low contact resistance can be obtained in the opening portion. As well as the fifth embodiment, since the resistive thin film is protected by the thin upper silicon oxide film and the plasma silicon oxide film, an effect of the film stress of each of the thin silicon nitride film formed as a lower layer and the plasma silicon oxide film formed as an upper layer to the resistive thin film can be decreased.

Moreover, in the manufacturing method according to the present embodiment, a thin upper silicon oxide film 25 is formed over the surface of the substrate by low pressure CVD by the manufacturing method according to the second embodiment. After that, the three-layer film including the resistive thin film 34, the barrier film 31 and the aluminum film or the aluminum alloy film 32 is formed. The three-layer film is used as the upper electrode of the capacitor, the lower wiring of a two-layer wiring region and the thin film resistor. The thin film resistor has a structure that the aluminum film or the aluminum alloy film 32 for obtaining an electrical connection is arranged over an end portion of the resistive thin film 34 through the barrier film 31. The three-layer film is processed to be a desired shape, and a via hole for connecting the three-layer film is formed so that the three-layer film becomes a part of a desired circuit. And then, a contact hole is formed, the aluminum wiring 12 is formed, and the plasma silicon nitride film 13 is formed to protect the surface of the semiconductor substrate. Thereby, the manufacturing of the semiconductor device according to the present embodiment is completed.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising:
    forming a capacitor, a transistor and a diffusion resistor in a p-type silicon substrate having a (111)-plane orientation and an off-set angle in a range between 3 degrees and 4 degrees;
    forming a junction separation layer for separating each of the capacitor, the transistor and the diffusion resistor in the substrate;
    forming a thermal oxide film over the substrate;
    forming a first opening in the thermal oxide film to expose the substrate;
    forming a CVD oxide film over the thermal oxide film and the exposed substrate;
    forming a second opening corresponding to the first opening in the CVD oxide film to expose the substrate;
    forming a first silicon oxide film by thermal oxidation over the exposed portion of the substrate via the second opening;
    forming a first silicon nitride film by low pressure CVD over the CVD oxide film, the first silicon oxide film and a sidewall of the second opening, and over the junction separation layer via the thermal oxide film and the CVD oxide film;
    removing a portion of the first silicon nitride film in the second opening to expose the first silicon oxide film;
    forming a third opening in the first silicon nitride film to expose the CVD oxide film over the junction separation layer together with the removing the portion of the first silicon nitride film;
    forming a second silicon oxide film by low pressure CVD over the exposed portion of the first silicon oxide film, the first silicon nitride film and in the third opening;
    etching a region of the first silicon oxide film and the second silicon oxide film, the region in which the first silicon oxide film and the second silicon oxide film are directly contacted, so that a contact hole to reach the substrate is formed;
    forming a wiring including aluminum in the contact hole; and
    forming a second silicon nitride film by plasma CVD as a protecting film over the wiring,
    wherein a thickness of each of the first silicon oxide film, the first silicon nitride film and the second silicon oxide film is smaller than a thickness of each of the thermal oxide film and the CVD oxide film.

2. The method for manufacturing the semiconductor device according to claim 1,
    wherein a dimension of the second opening is larger than a dimension of the contact hole.

3. The method for manufacturing the semiconductor device according to claim 1, further comprising:
    forming an embedded n-type layer in the substrate;
    forming an n-type epitaxial layer over the embedded n-type layer and in the substrate; and
    forming an n-type diffusion layer over the n-type epitaxial layer and in the substrate, wherein the embedded n-type layer, the n-type epitaxial layer and the n-type diffusion layer provide the capacitor,
    wherein phosphorous is added in the n-type diffusion layer.

4. The method for manufacturing the semiconductor device according to claim 1,
    wherein the second silicon oxide film is made of organic silicon compound including TEOS as a main material.

5. A method for manufacturing a semiconductor device comprising:
    forming a capacitor, a transistor and a diffusion resistor in a p-type silicon substrate having a (111)-plane orientation and an off-set angle in a range between 3 degrees and 4 degrees;
    forming a junction separation layer for separating each of the capacitor, the transistor and the diffusion resistor in the substrate;
    forming a thermal oxide film over the substrate;
    forming a first opening in the thermal oxide film to expose the substrate;
    forming a CVD oxide film over the thermal oxide film and the exposed substrate;
    forming a second opening corresponding to the first opening in the CVD oxide film to expose the substrate;
    forming a first silicon oxide film by low pressure CVD over the exposed portion of the substrate via the second opening, the CVD oxide film and a sidewall of the second opening, and over the junction separation layer via the thermal oxide film and the CVD oxide film;

forming a first silicon nitride film by low pressure CVD over the first silicon oxide film, and over the junction separation layer via the thermal oxide film, the CVD oxide film and the first silicon oxide film;

removing a portion of the first silicon nitride film, the portion being in the second opening, to expose the first silicon oxide film;

forming a third opening in the first silicon nitride film to expose the first silicon oxide film over the junction separation layer together with the removing the portion of the first silicon nitride film;

forming a second silicon oxide film by low pressure CVD over the exposed portion of the first silicon oxide film, the first silicon nitride film and in the third opening;

etching a region of the first silicon oxide film and the second silicon oxide film in the second opening, the region in which the first silicon oxide film and the second silicon oxide film are directly contacted, so that a contact hole to reach the substrate is formed;

forming a wiring including aluminum in the contact hole; and forming a second silicon nitride film by plasma CVD as a protecting film over the wiring, wherein a thickness of each of the first silicon oxide film, the first silicon nitride film and the second silicon oxide film is smaller than a thickness of each of the thermal oxide film and the CVD oxide film.

6. The method for manufacturing the semiconductor device according to claim 5, wherein a dimension of the second opening is larger than a dimension of the contact hole.

7. The method for manufacturing the semiconductor device according to claim 5, further comprising:

forming an embedded n-type layer in the substrate;

forming an n-type epitaxial layer over the embedded n-type layer and in the substrate; and forming an n-type diffusion layer over the n-type epitaxial layer and in the substrate, wherein the embedded n-type layer, the n-type epitaxial layer and the n-type diffusion layer provide the capacitor, wherein phosphorous is added in the n-type diffusion layer.

8. The method for manufacturing the semiconductor device according to claim 5, wherein the first silicon oxide film and the second silicon oxide film are made from the same material.

9. The method for manufacturing the semiconductor device according to claim 5, wherein the first silicon oxide film and the second silicon oxide film are made of organic silicon compound including TEOS as a main material.

10. A method for manufacturing a semiconductor device comprising:

forming a capacitor, a transistor and a diffusion resistor in a p-type silicon substrate having a (111)-plane orientation and an off-set angle in a range between 3 degrees and 4 degrees;

forming a junction separation layer for separating each of the capacitor, the transistor and the diffusion resistor in the substrate;

forming a thermal oxide film over the substrate;

forming a first opening in the thermal oxide film to expose the substrate;

forming a CVD oxide film over the thermal oxide film and the exposed substrate;

forming a second opening corresponding to the first opening in the CVD oxide film to expose the substrate;

forming a first silicon oxide film by thermal oxidation over the exposed portion of the substrate via the second opening;

forming a first silicon nitride film by low pressure CVD over the CVD oxide film, the first silicon oxide film and a sidewall of the second opening, and over the junction separation layer via the thermal oxide film and the CVD oxide film;

removing a portion of the first silicon nitride film in the second opening to expose the first silicon oxide film;

forming a third opening in the first silicon nitride film to expose the CVD oxide film over the junction separation layer together with the removing the portion of the first silicon nitride film;

forming a second silicon oxide film by low pressure CVD over the exposed portion of the first silicon oxide film, the first silicon nitride film and in the third opening;

forming a barrier film made of at least one of refractory metal and refractory metal alloy over the junction separation layer via the second silicon oxide film;

forming at least one of an aluminum film and an aluminum alloy film over the barrier film;

forming a third silicon oxide film by plasma CVD over the second silicon oxide film, and over the junction separation layer via the at least one of the aluminum film and the aluminum alloy film;

etching a region of the first silicon oxide film, the second silicon oxide film and the third silicon oxide film, the region in which the first silicon oxide film, the second silicon oxide film and the third silicon oxide film are directly coupled, so that a contact hole to reach the substrate is formed;

forming a via hole in the third silicon oxide film and over the junction separation layer, the via hole reaching the at least one of the aluminum film and the aluminum alloy film together with the etching the region;

forming a wiring including aluminum in the contact hole and the via hole; and forming a second silicon nitride film by plasma CVD as a protecting film over the wiring, wherein a thickness of each of the first silicon oxide film, the first silicon nitride film and the second silicon oxide film is smaller than a thickness of each of the thermal oxide film and the CVD oxide film.

11. The method for manufacturing the semiconductor device according to claim 10, wherein a dimension of the second opening is larger than a dimension of the contact hole.

12. The method for manufacturing the semiconductor device according to claim 10, further comprising:

forming an embedded n-type layer in the substrate;

forming an n-type epitaxial layer over the embedded n-type layer and in the substrate; and forming an n-type diffusion layer over the n-type epitaxial layer and in the substrate, wherein the embedded n-type layer, the n-type epitaxial layer and the n-type diffusion layer provide the capacitor, wherein phosphorous is added in the n-type diffusion layer.

13. The method for manufacturing the semiconductor device according to claim 10, wherein the second silicon oxide film is made of organic silicon compound including TEOS as a main material.

14. The method for manufacturing the semiconductor device according to claim 10, further comprising:
- processing a two-layer film including the barrier film and the at least one of the aluminum film and the aluminum alloy film to be a desired planer shape to provide a lower wiring; and
- coupling the two-layer film with the wiring including aluminum through the via hole, wherein the wiring provides an upper wiring.

15. The method for manufacturing the semiconductor device according to claim 10,
- wherein the barrier film includes at least one of titanium and titanium-tungsten alloy.

16. The method for manufacturing the semiconductor device according to claim 10,
- wherein a two-layer film including the barrier film and at least one of the aluminum film and the aluminum alloy film is processed by wet etching so as to suppress damage to the capacitor.

17. The method for manufacturing the semiconductor device according to claim 10,
- wherein the contact hole is formed by wet etching so that the wiring in the contact hole has a resistance equal to or smaller than a predetermined resistance.

18. A method for manufacturing a semiconductor device comprising:
- forming a capacitor, a transistor and a diffusion resistor in a p-type silicon substrate having a (111)-plane orientation and an off-set angle in a range between 3 degrees and 4 degrees;
- forming a junction separation layer for separating each of the capacitor, the transistor and the diffusion resistor in the substrate;
- forming a thermal oxide film over the substrate;
- forming a first opening in the thermal oxide film to expose the substrate;
- forming a CVD oxide film over the thermal oxide film and the exposed substrate;
- forming a second opening corresponding to the first opening in the CVD oxide film to expose the substrate;
- forming a first silicon oxide film by low pressure CVD over the exposed portion of the substrate via the second opening, the CVD oxide film and a sidewall of the second opening, and over the junction separation layer via the thermal oxide film and the CVD oxide film;
- forming a first silicon nitride film by low pressure CVD over the first silicon oxide film, and over the junction separation layer via the thermal oxide film, the CVD oxide film and the first silicon oxide film;
- removing a portion of the first silicon nitride film, the portion being in the second opening, to expose the first silicon oxide film;
- forming a third opening in the first silicon nitride film to expose the first silicon oxide film over the junction separation layer together with the removing the portion of the first silicon nitride film;
- forming a second silicon oxide film by low pressure CVD over the exposed portion of the first silicon oxide film, the first silicon nitride film and in the third opening;
- forming a barrier film made of at least one of refractory metal and refractory metal alloy over the junction separation layer via the second silicon oxide film;
- forming at least one of an aluminum film and an aluminum alloy film over the barrier film;
- forming a third silicon oxide film by plasma CVD over the second silicon oxide film, and over the junction separation layer via the at least one of the aluminum film and the aluminum alloy film;
- etching a region of the first silicon oxide film, the second silicon oxide film and the third silicon oxide film in the second opening, the region in which the first silicon oxide film, the second silicon oxide film and the third silicon oxide film are directly coupled, so that a contact hole to reach the substrate is formed;
- forming a via hole in the third silicon oxide film and over the junction separation layer, the via hole reaching the at least the aluminum film and the aluminum alloy film together with the etching the region;
- forming a wiring including aluminum in the contact hole and the via hole; and
- forming a second silicon nitride film by plasma CVD as a protecting film over the wiring,
- wherein a thickness of each of the first silicon oxide film, the first silicon nitride film and the second silicon oxide film is smaller than a thickness of each of the thermal oxide film and the CVD oxide film.

19. The method for manufacturing the semiconductor device according to claim 18,
- wherein a dimension of the second opening is larger than a dimension of the contact hole.

20. The method for manufacturing the semiconductor device according to claim 18, further comprising:
- forming an embedded n-type layer in the substrate;
- forming an n-type epitaxial layer over the embedded n-type layer and in the substrate; and
- forming an n-type diffusion layer over the n-type epitaxial layer and in the substrate, wherein the embedded n-type layer, the n-type epitaxial layer and the n-type diffusion layer provide the capacitor,
- wherein phosphorous is added in the n-type diffusion layer.

21. The method for manufacturing the semiconductor device according to claim 18,
- wherein the first silicon oxide film and the second silicon oxide film are made from the same material.

22. The method for manufacturing the semiconductor device according to claim 18,
- wherein the first silicon oxide film and the second silicon oxide film are made of organic silicon compound including TEOS as a main material.

23. The method for manufacturing the semiconductor device according to claim 18, further comprising:
- processing a two-layer film including the barrier film and the at least one of the aluminum film and the aluminum alloy film to be a desired planer shape to provide a lower wiring; and
- coupling the two-layer film with the wiring including aluminum through the via hole, wherein the wiring provides an upper wiring.

24. The method for manufacturing the semiconductor device according to claim 18,
- wherein the barrier film includes at least one of titanium and titanium-tungsten alloy.

25. The method for manufacturing the semiconductor device according to claim 18,
- wherein a two-layer film including the barrier film and at least one of the aluminum film and the aluminum alloy film is processed by wet etching so as to suppress damage to the capacitor.

26. The method for manufacturing the semiconductor device according to claim 18,
wherein the contact hole is formed by wet etching so that the wiring in the contact hole has a resistance equal to or smaller than a predetermined resistance.

27. A method for manufacturing a semiconductor device comprising:
forming a capacitor, a transistor and a diffusion resistor in a p-type silicon substrate having a (111)-plane orientation and an off-set angle in a range between 3 degrees and 4 degrees;
forming a junction separation layer for separating each of the capacitor, the transistor and the diffusion resistor in the substrate;
forming a thermal oxide film over the substrate;
forming a first opening in the thermal oxide film to expose the substrate;
forming a CVD oxide film over the thermal oxide film and the exposed substrate;
forming a second opening corresponding to the first opening in the CVD oxide film to expose the substrate;
forming a first silicon oxide film by thermal oxidation over the exposed portion of the substrate via the second opening;
forming a first silicon nitride film by low pressure CVD over the CVD oxide film, the first silicon oxide film and a sidewall of the second opening, and over the junction separation layer via the thermal oxide film and the CVD oxide film;
removing a portion of the first silicon nitride film in the second opening to expose the first silicon oxide film;
forming a third opening in the first silicon nitride film to expose the CVD oxide film over the junction separation layer together with the removing the portion of the first silicon nitride film;
forming a second silicon oxide film by low pressure CVD over the exposed portion of the first silicon oxide film, the first silicon nitride film and in the third opening;
forming a resistive thin film made of at least one of metal and metal silicide over the junction separation layer via the second silicon oxide film;
forming a barrier film made of at least one of refractory metal and refractory metal alloy over the resistive thin film;
forming at least one of an aluminum film and an aluminum alloy film over the barrier film;
forming a third silicon oxide film by plasma CVD over the second silicon oxide film, and over the junction separation layer via the at least one of the aluminum film and the aluminum alloy film;
etching a region of the first silicon oxide film, the second silicon oxide film and the third silicon oxide film, the region in which the first silicon oxide film, the second silicon oxide film and the third silicon oxide film are directly coupled, so that a contact hole to reach the substrate is formed;
forming a via hole in the third silicon oxide film and over the junction separation layer, the via hole reaching the at least one of the aluminum film and the aluminum alloy film together with the etching the region;
forming a wiring including aluminum in the contact hole and the via hole; and
forming a second silicon nitride film by plasma CVD as a protecting film over the wiring,
wherein a thickness of each of the first silicon oxide film, the first silicon nitride film and the second silicon oxide film is smaller than a thickness of each of the thermal oxide film and the CVD oxide film.

28. The method for manufacturing the semiconductor device according to claim 27,
wherein a dimension of the second opening is larger than a dimension of the contact hole.

29. The method for manufacturing the semiconductor device according to claim 27, further comprising:
forming an embedded n-type layer in the substrate;
forming an n-type epitaxial layer over the embedded n-type layer and in the substrate; and
forming an n-type diffusion layer over the n-type epitaxial layer and in the substrate, wherein the embedded n-type layer, the n-type epitaxial layer and the n-type diffusion layer provide the capacitor,
wherein phosphorous is added in the n-type diffusion layer.

30. The method for manufacturing the semiconductor device according to claim 27,
wherein the second silicon oxide film is made of organic silicon compound including TEOS as a main material.

31. The method for manufacturing the semiconductor device according to claim 27, further comprising:
processing a three-layer film including the resistive thin film, the barrier film and the at least one of the aluminum film and the aluminum alloy film to be a desired planer shape to provide a lower wiring; and
coupling the three-layer film with the wiring including aluminum through the via hole, wherein the wiring provides an upper wiring.

32. The method for manufacturing the semiconductor device according to claim 27, further comprising:
processing a three-layer film including the resistive thin film, the barrier film and the at least one of the aluminum film and the aluminum alloy film to be a desired planer shape to provide one electrode of the capacitor.

33. The method for manufacturing the semiconductor device according to claim 27,
wherein the resistive thin film is a chromium silicon nitride film formed by reactive sputtering.

34. The method for manufacturing the semiconductor device according to claim 27,
wherein the barrier film includes at least one of titanium and titanium-tungsten alloy.

35. The method for manufacturing the semiconductor device according to claim 27,
wherein a portion of the at least one of the aluminum film and the aluminum alloy film and a portion of the barrier film are removed by wet etching so as to suppress damage to the resistive thin film so that the resistive thin film provides the diffusion resistor.

36. The method for manufacturing the semiconductor device according to claim 27,
wherein the contact hole is formed by wet etching so that the wiring in the contact hole has a resistance equal to or smaller than a predetermined resistance.

37. A method for manufacturing a semiconductor device comprising:
forming a capacitor, a transistor and a diffusion resistor in a p-type silicon substrate having a (111)-plane orientation and an off-set angle in a range between 3 degrees and 4 degrees;
forming a junction separation layer for separating each of the capacitor, the transistor and the diffusion resistor in the substrate;
forming a thermal oxide film over the substrate;
forming a first opening in the thermal oxide film to expose the substrate;

forming a CVD oxide film over the thermal oxide film and the exposed substrate;

forming a second opening corresponding to the first opening in the CVD oxide film to expose the substrate;

forming a first silicon oxide film by low pressure CVD over the exposed portion of the substrate via the second opening, the CVD oxide film and a sidewall of the second opening, and over the junction separation layer via the thermal oxide film and the CVD oxide film;

forming a first silicon nitride film by low pressure CVD over the first silicon oxide film, and over the junction separation layer via the thermal oxide film, the CVD oxide film and the first silicon oxide film;

removing a portion of the first silicon nitride film, the portion being in the second opening, to expose the first silicon oxide film;

forming a third opening in the first silicon nitride film to expose the first silicon oxide film over the junction separation layer together with the removing the portion of the first silicon nitride film;

forming a second silicon oxide film by low pressure CVD over the exposed portion of the first silicon oxide film, the first silicon nitride film and in the third opening;

forming a resistive thin film made of at least one of metal and metal silicide over the junction separation layer via the second silicon oxide film;

forming a barrier film made of at least one of refractory metal and refractory metal alloy over the resistive thin film;

forming at least one of an aluminum film and an aluminum alloy film over the barrier film;

forming a third silicon oxide film by plasma CVD over the second silicon oxide film, and over the junction separation layer via the at least one of the aluminum film and the aluminum alloy film;

etching a region of the first silicon oxide film, the second silicon oxide film and the third silicon oxide film in the second opening, the region in which the first silicon oxide film, the second silicon oxide film and the third silicon oxide film are directly coupled, so that a contact hole to reach the substrate is formed;

forming a via hole in the third silicon oxide film and over the junction separation layer, the via hole reaching the at least the aluminum film and the aluminum alloy film together with the etching the region;

forming a wiring including aluminum in the contact hole and the via hole; and forming a second silicon nitride film by plasma CVD as a protecting film over the wiring, wherein a thickness of each of the first silicon oxide film, the first silicon nitride film and the second silicon oxide film is smaller than a thickness of each of the thermal oxide film and the CVD oxide film.

38. The method for manufacturing the semiconductor device according to claim 37,
wherein a dimension of the second opening is larger than a dimension of the contact hole.

39. The method for manufacturing the semiconductor device according to claim 37, further comprising:
forming an embedded n-type layer in the substrate;
forming an n-type epitaxial layer over the embedded n-type layer and in the substrate; and
forming an n-type diffusion layer over the n-type epitaxial layer and in the substrate, wherein the embedded n-type layer, the n-type epitaxial layer and the n-type diffusion layer provide the capacitor,
wherein phosphorous is added in the n-type diffusion layer.

40. The method for manufacturing the semiconductor device according to claim 37,
wherein the first silicon oxide film and the second silicon oxide film are made from the same material.

41. The method for manufacturing the semiconductor device according to claim 37,
wherein the first silicon oxide film and the second silicon oxide film are made of organic silicon compound including TEOS as a main material.

42. The method for manufacturing the semiconductor device according to claim 37, further comprising:
processing a three-layer film including the resistive thin film, the barrier film and the at least one of the aluminum film and the aluminum alloy film to be a desired planer shape to provide a lower wiring; and
coupling the three-layer film with the wiring including aluminum through the via hole, wherein the wiring provides an upper wiring.

43. The method for manufacturing the semiconductor device according to claim 37, further comprising:
processing a three-layer film including the resistive thin film, the barrier film and the at least one of the aluminum film and the aluminum alloy film to be a desired planer shape to provide one electrode of the capacitor.

44. The method for manufacturing the semiconductor device according to claim 37,
wherein the resistive thin film is a chromium silicon nitride film formed by reactive sputtering.

45. The method for manufacturing the semiconductor device according to claim 37,
wherein the barrier film includes at least one of titanium and titanium-tungsten alloy.

46. The method for manufacturing the semiconductor device according to claim 37,
wherein a portion of the at least one of the aluminum film and the aluminum alloy film and a portion of the barrier film are removed by wet etching so as to suppress damage to the resistive thin film so that the resistive thin film provides the diffusion resistor.

47. The method for manufacturing the semiconductor device according to claim 37,
wherein the contact hole is formed by wet etching so that the wiring in the contact hole has a resistance equal to or smaller than a predetermined resistance.

48. A semiconductor device comprising:
a p-type silicon substrate having a (111)-plane orientation and an off-set angle in a range between 3 degrees and 4 degrees;
a capacitor, a transistor and a diffusion resistor in the substrate;
a junction separation layer disposed in the substrate for separating each of the capacitor, the transistor and the diffusion resistor;
a laminated layer including a thermal oxide film and a CVD oxide film over the substrate;
a first trench penetrating the laminated layer and reaching the substrate;
a first silicon oxide film over a bottom surface of the first trench;
a first silicon nitride film over the laminated layer, a sidewall of the first trench, and a first portion of the first silicon oxide film;
a second trench penetrating the first silicon nitride film over the junction separation layer;
a second silicon oxide film over the first silicon nitride film, a second portion of the first silicon oxide film and in the second trench;

a contact hole reaching the substrate arranged in a region of the first silicon oxide film and the second silicon oxide film, the region in which the first silicon oxide film and the second silicon oxide film are directly contacted;
a wiring including aluminum in the contact hole; and
a second silicon nitride film as a protecting film over the wiring, wherein a thickness of each of the first silicon oxide film, the first silicon nitride film and the second silicon oxide film is smaller than a thickness of each of the thermal oxide film and the CVD oxide film.

* * * * *